United States Patent
Yamamoto et al.

(10) Patent No.: US 12,211,687 B2
(45) Date of Patent: Jan. 28, 2025

(54) SUBSTRATE TREATMENT APPARATUS AND SUBSTRATE TREATMENT METHOD

(71) Applicant: SCREEN Holdings Co., Ltd., Kyoto (JP)

(72) Inventors: Shigeru Yamamoto, Kyoto (JP); Daiki Fujii, Kyoto (JP); Keiji Iwata, Kyoto (JP); Kenji Edamitsu, Kyoto (JP); Yuya Kawai, Kyoto (JP); Kenichi Ito, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 17/558,595

(22) Filed: Dec. 22, 2021

(65) Prior Publication Data
US 2022/0208545 A1  Jun. 30, 2022

(30) Foreign Application Priority Data

Dec. 28, 2020 (JP) .................................. 2020-218977

(51) Int. Cl.
| | | |
|---|---|---|
| H01L 21/02 | (2006.01) | |
| B08B 3/04 | (2006.01) | |
| H01L 21/67 | (2006.01) | |

(52) U.S. Cl.
CPC .......... *H01L 21/02057* (2013.01); *B08B 3/04* (2013.01); *H01L 21/67057* (2013.01)

(58) Field of Classification Search
None
See application file for complete search history.

(56) References Cited

U.S. PATENT DOCUMENTS

| | | | |
|---|---|---|---|
| 7,749,909 B2 | 7/2010 | Tomita et al. | |
| 7,838,425 B2 | 11/2010 | Tomita et al. | |
| 7,985,683 B2 | 7/2011 | Tomita et al. | |
| 9,859,111 B2 | 1/2018 | Ogawa et al. | |
| 9,991,111 B2 | 6/2018 | Ogawa et al. | |
| 10,903,091 B2 | 1/2021 | Hashizume | |
| 10,921,057 B2 | 2/2021 | Okutani et al. | |
| 11,660,644 B2 | 5/2023 | Iwasaki et al. | |

(Continued)

FOREIGN PATENT DOCUMENTS

| | | |
|---|---|---|
| JP | H0722364 | 1/1995 |
| JP | 2008034428 | 2/2008 |

(Continued)

OTHER PUBLICATIONS

JP2019140401 English translation, accessed on Aug. 2023. (Year: 2019).*

*Primary Examiner* — Eric W Golightly
*Assistant Examiner* — Arlyn I Rivera-Cordero
(74) *Attorney, Agent, or Firm* — JCIPRNET

(57) ABSTRACT

A substrate treatment method includes a rinsing step of performing treatment of a substrate with a rinse liquid, an immersing step of immersing the substrate in a diluted isopropyl alcohol (dIPA) stored in a treatment tank after the rinsing step, a first isopropyl alcohol treatment step of performing treatment of the substrate with an isopropyl alcohol after the immersing step, and a water-repellent treatment step of performing water-repellent treatment of the substrate after the first isopropyl alcohol treatment step.

13 Claims, 14 Drawing Sheets

(56) References Cited

U.S. PATENT DOCUMENTS

| | | | |
|---|---|---|---|
| 2009/0311874 A1* | 12/2009 | Tomita | H01L 21/3086 |
| | | | 438/759 |
| 2010/0075504 A1 | 3/2010 | Tomita et al. | |
| 2010/0240219 A1 | 9/2010 | Tomita et al. | |
| 2011/0143541 A1* | 6/2011 | Ogawa | H01L 21/67028 |
| | | | 438/694 |
| 2015/0034130 A1* | 2/2015 | Koide | H01L 21/67051 |
| | | | 134/26 |
| 2016/0089696 A1 | 3/2016 | Kimura | |
| 2016/0118275 A1 | 4/2016 | Inoue et al. | |
| 2017/0345683 A1 | 11/2017 | Sasaki et al. | |
| 2020/0286739 A1 | 9/2020 | Fujiwara et al. | |
| 2020/0303220 A1 | 9/2020 | Kagawa et al. | |
| 2021/0276052 A1* | 9/2021 | Iwasaki | H01L 21/67051 |
| 2023/0256479 A1 | 8/2023 | Iwasaki et al. | |

FOREIGN PATENT DOCUMENTS

| | | | | |
|---|---|---|---|---|
| JP | 2010114414 | | 5/2010 | |
| JP | 2011124410 | | 6/2011 | |
| JP | 2015032735 | | 2/2015 | |
| JP | 2017041505 | | 2/2017 | |
| JP | 2018182212 | | 11/2018 | |
| JP | 2019140401 | * | 8/2019 | H01L 21/304 |
| KR | 20170086443 | | 7/2017 | |
| KR | 20180021183 | | 2/2018 | |
| TW | 201939600 | | 10/2019 | |

* cited by examiner

SUBSTRATE TREATMENT APPARATUS AND SUBSTRATE TREATMENT METHOD

CROSS-REFERENCE TO RELATED APPLICATION

This application claims the priority benefit of Japan application serial no. 2020-218977, filed on Dec. 28, 2020. The entirety of the above-mentioned patent application is hereby incorporated by reference herein and made a part of this specification.

BACKGROUND

Technical Field

The disclosure relates to a substrate treatment apparatus and a substrate treatment method.

Description of Related Art

It is known that substrates used in electronic components of semiconductor devices, liquid crystal display devices, and the like are treated by a substrate treatment apparatus. There has been increasing demand for uniform treatment of substrates in accordance with miniaturization and/or three-dimensionalization of semiconductor elements formed on semiconductor substrates in recent years. For example, a NAND element having a three-dimensional structure has a layered structure provided with a three-dimensional uneven structure.

Substrates may be treated by being immersed in a stored liquid inside a treatment tank. A step of manufacturing a product such as a semiconductor device by performing treatment of a substrate such as a semiconductor wafer includes a chemical solution treatment step of performing treatment of a substrate with a chemical solution, a rinsing step of removing the chemical solution from a surface of the substrate with a rinse liquid, and a drying treatment step of drying the substrate.

However, in the drying treatment step, a pattern formed on the surface of the substrate may collapse. Collapse of a pattern is caused due to the surface tension of a rinse liquid which has invaded the inside of the pattern. Hence, in order to avoid collapse of a pattern, the pattern may be covered with a water-repellent protective film by supplying a water repellent agent to a substrate.

For example, chemical solution treatment, pure water rinse treatment, alcohol rinse treatment, water-repellent treatment, alcohol rinse treatment, pure water rinse treatment, and drying treatment may be sequentially executed with respect to a substrate. In this case, during the alcohol rinse treatment after the water-repellent treatment, a water repellent agent which remains on a surface of the substrate is removed by being replaced with an isopropyl alcohol (IPA).

SUMMARY

According to an aspect of the disclosure, a substrate treatment method includes a rinsing step of performing treatment of a substrate with a rinse liquid, an immersing step of immersing the substrate in a diluted isopropyl alcohol stored in a treatment tank after the rinsing step, a first isopropyl alcohol treatment step of performing treatment of the substrate with an isopropyl alcohol after the immersing step, and a water-repellent treatment step of performing water-repellent treatment of the substrate after the first isopropyl alcohol treatment step.

According to another aspect of the disclosure, a substrate treatment apparatus includes a chamber; a treatment tank that is disposed inside the chamber and stores a stored liquid; a substrate holding part that holds a substrate and is able to move such that the substrate is immersed in the stored liquid in the treatment tank; a liquid supply part that supplies a diluted isopropyl alcohol as the stored liquid to the treatment tank; an isopropyl alcohol supply part that supplies vapor of an isopropyl alcohol to the inside of the chamber; a water repellent agent supply part that supplies vapor of a water repellent agent to the inside of the chamber; and a control part that controls the substrate holding part, the liquid supply part, the isopropyl alcohol supply part, and the water repellent agent supply part. The control part controls the substrate holding part, the isopropyl alcohol supply part, and the water repellent agent supply part such that after the substrate which has been treated with the rinse liquid is immersed in the diluted isopropyl alcohol stored in the treatment tank, the vapor of the isopropyl alcohol is supplied to the substrate, and then the vapor of the water repellent agent is supplied to the substrate.

Figure 3:
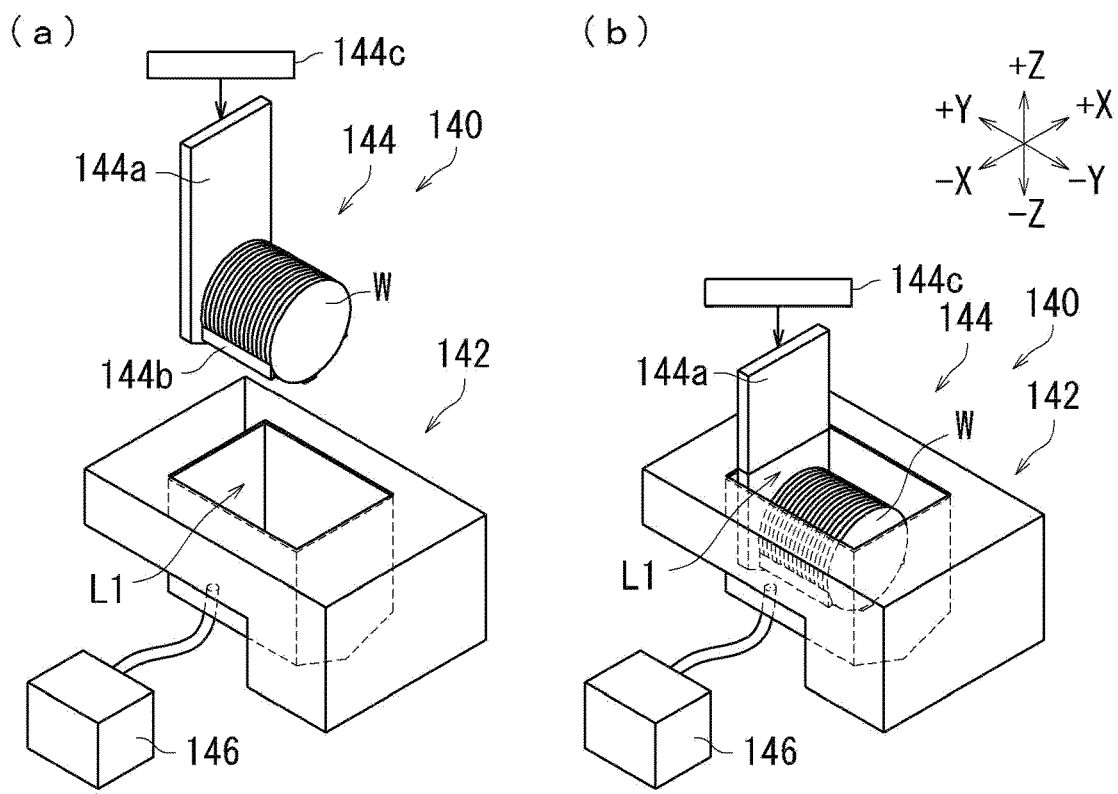

(a) and (b) of FIG. 3 are schematic views of a first treatment device in the substrate treatment apparatus of the present embodiment.

Figure 4:
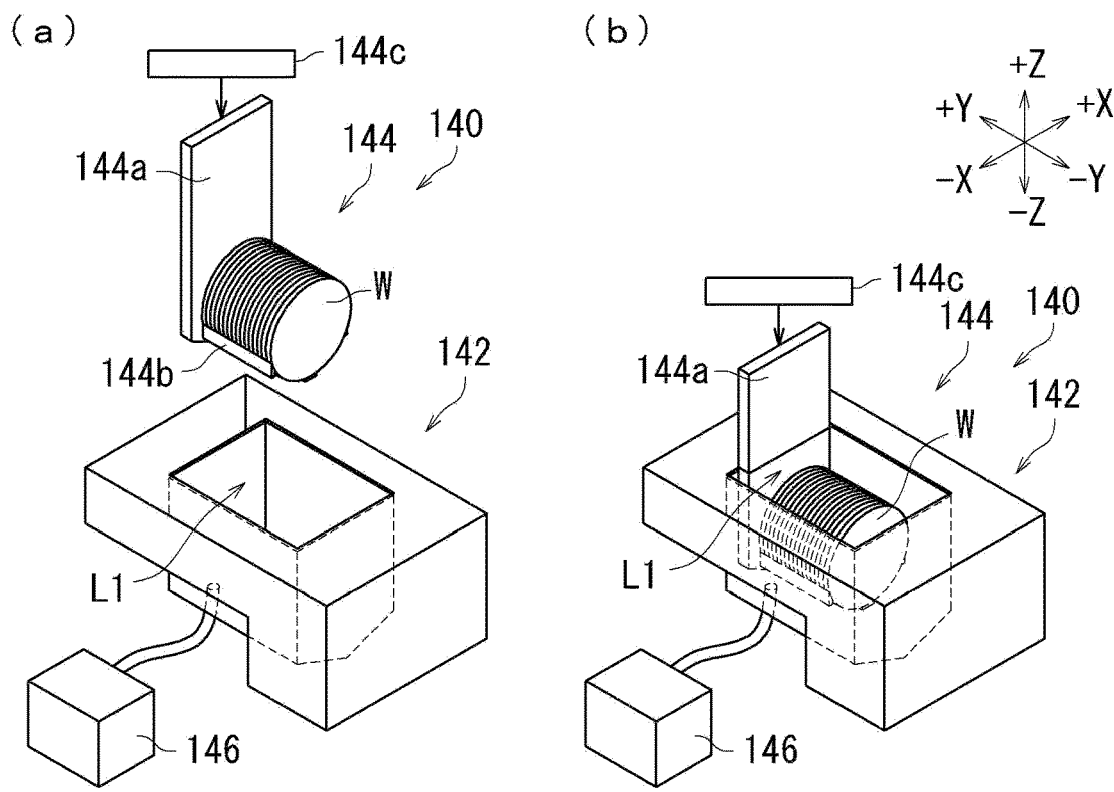

(a) and (b) of FIG. 4 are schematic views of a second treatment device in the substrate treatment apparatus of the present embodiment.

Figure 5:
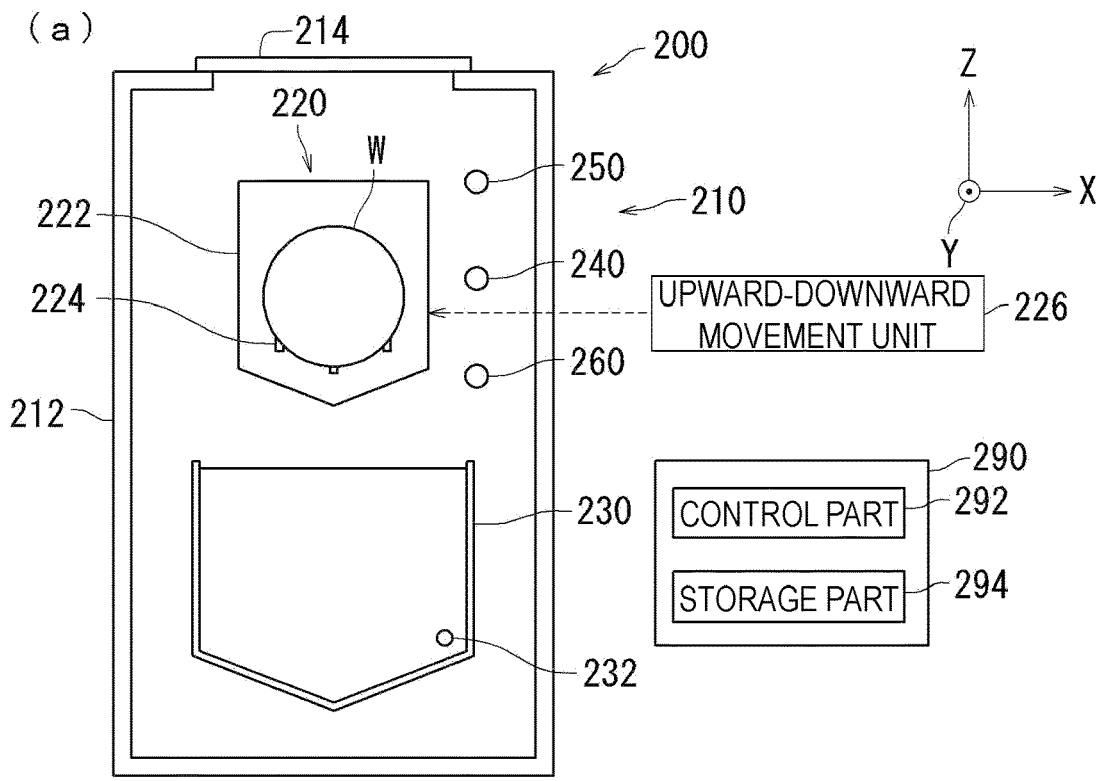
Figure 5:
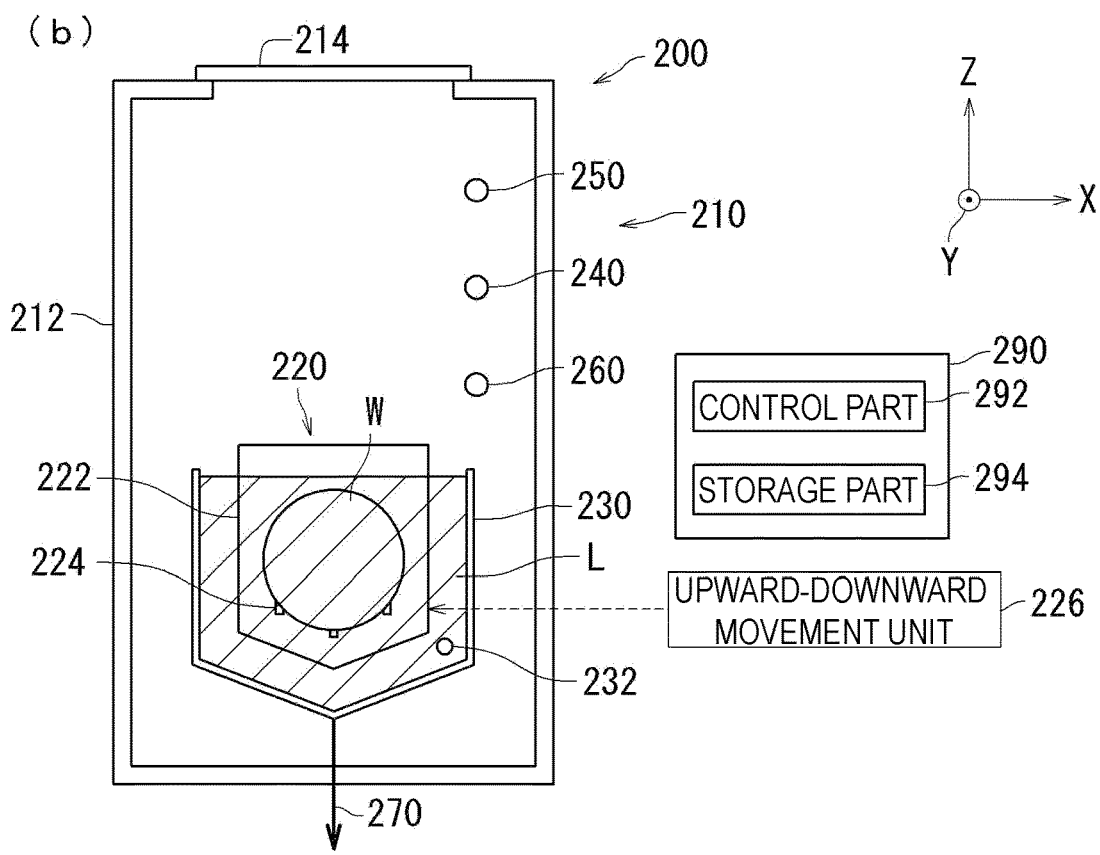

(a) and (b) of FIG. 5 are schematic views of a third treatment device in the substrate treatment apparatus of the present embodiment.

Figure 6:
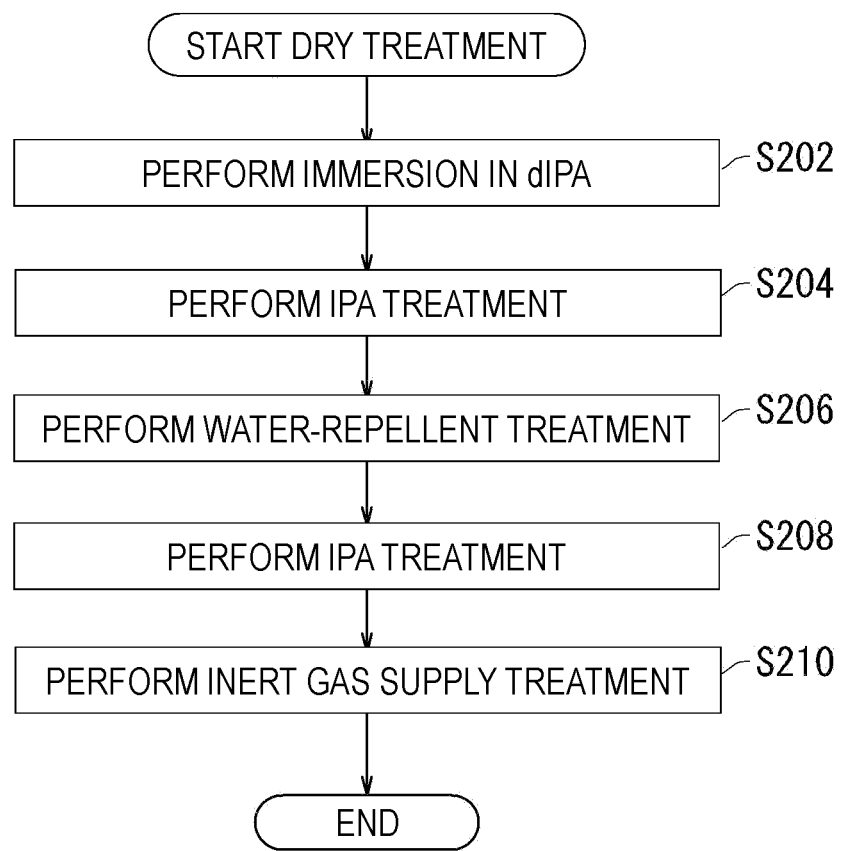

FIG. 6 is a flowchart of drying treatment performed by the substrate treatment apparatus of the present embodiment.

Figure 7:
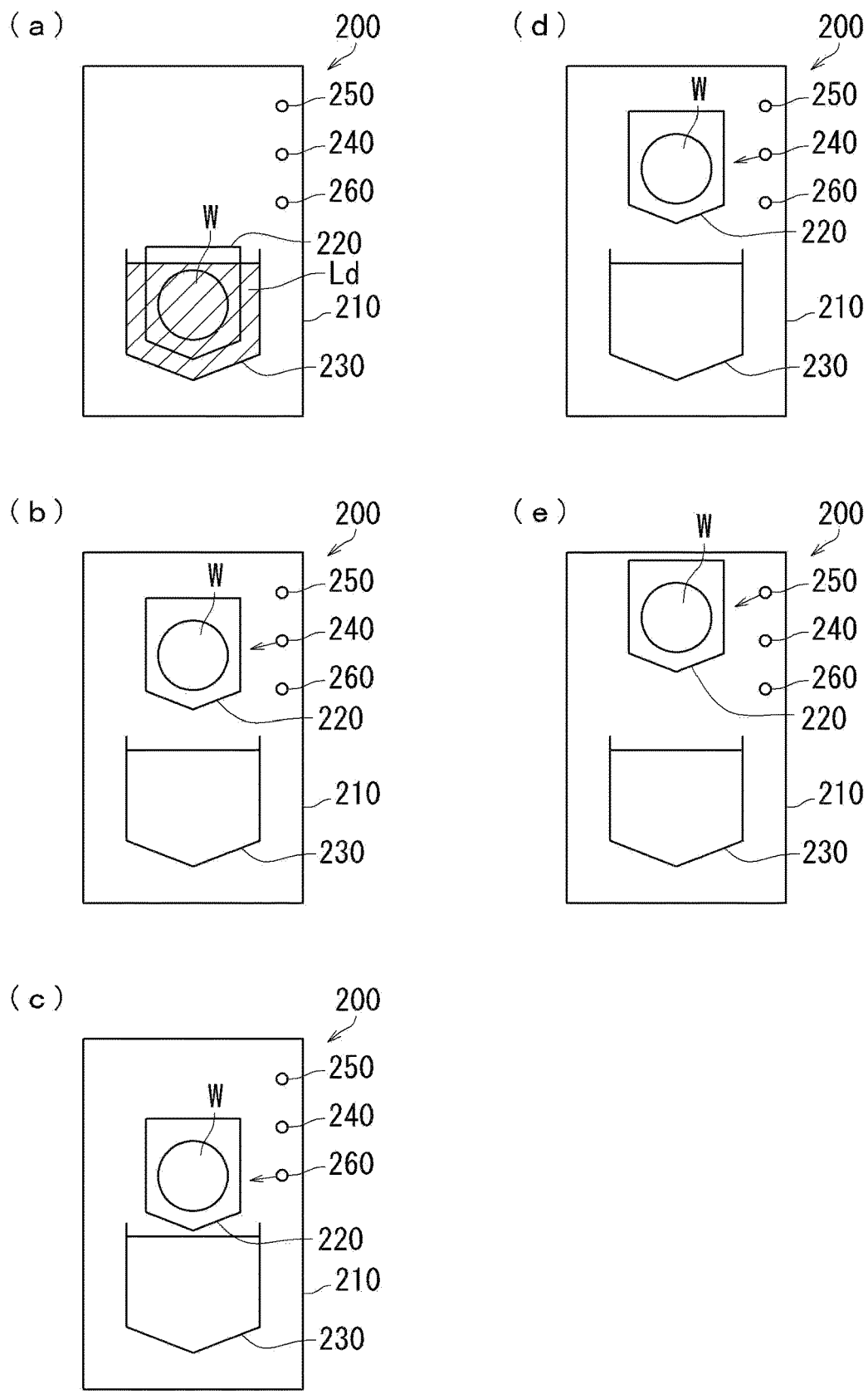

(a) to (e) of FIG. 7 are schematic explanatory views of drying treatment performed by the third treatment device in the substrate treatment apparatus of the present embodiment.

Figure 8:
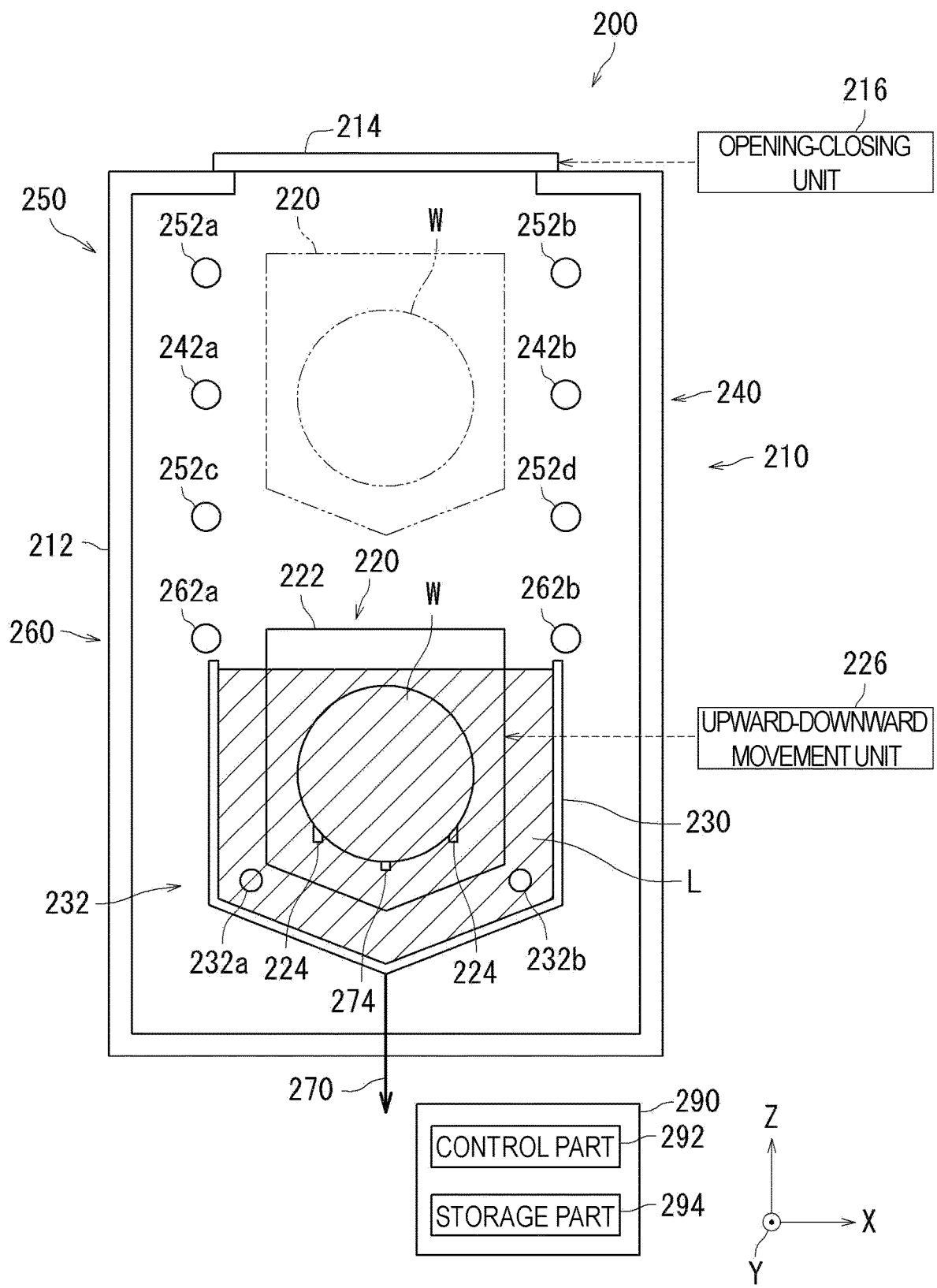

FIG. 8 is a schematic view of the third treatment device in the substrate treatment apparatus of the present embodiment.

Figure 9:
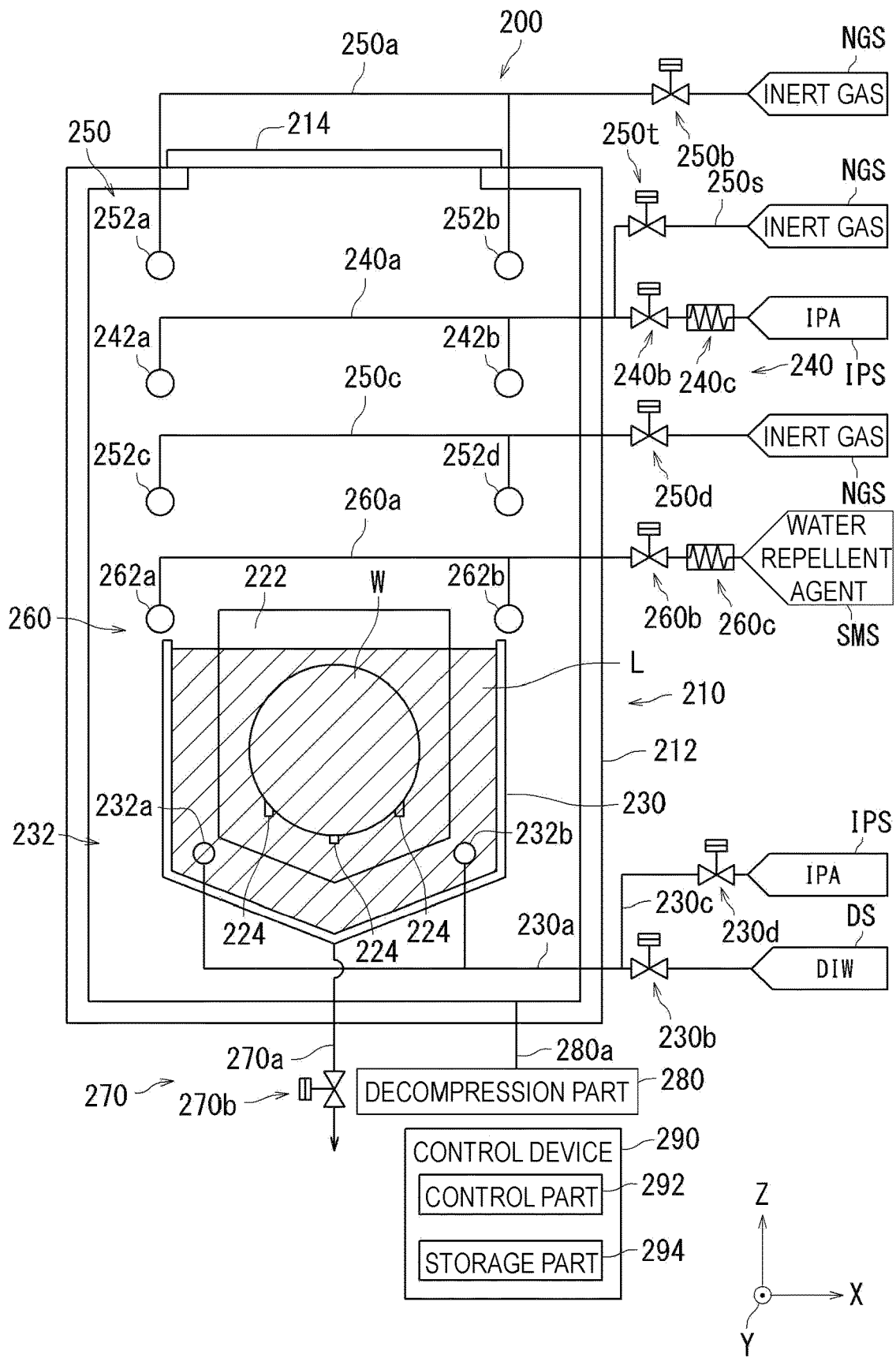

FIG. 9 is a schematic view of the third treatment device in the substrate treatment apparatus of the present embodiment.

Figure 10:
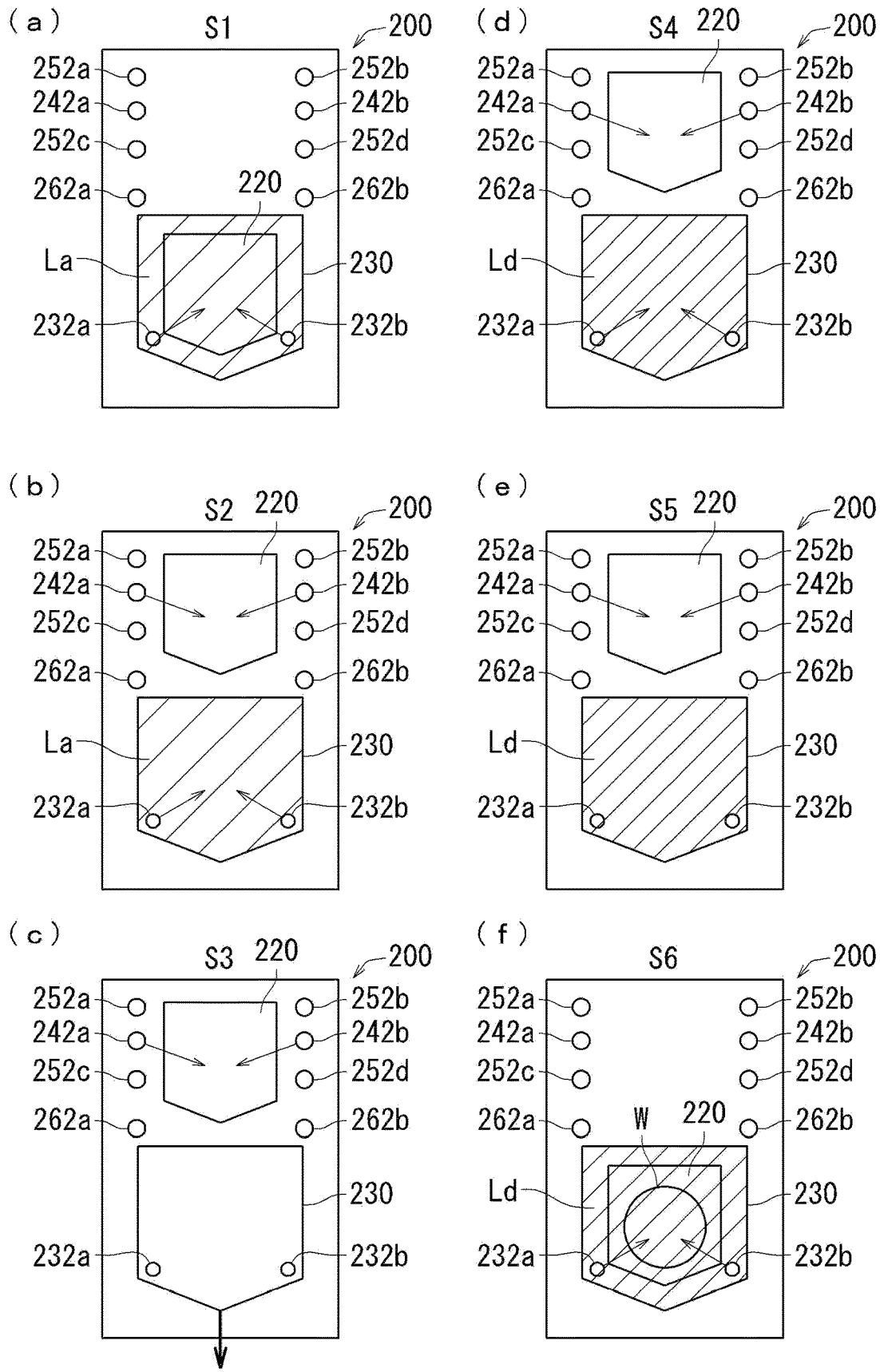

(a) to (f) of FIG. 10 are schematic explanatory views of a flow of drying treatment performed by the substrate treatment apparatus of the present embodiment.

Figure 11:
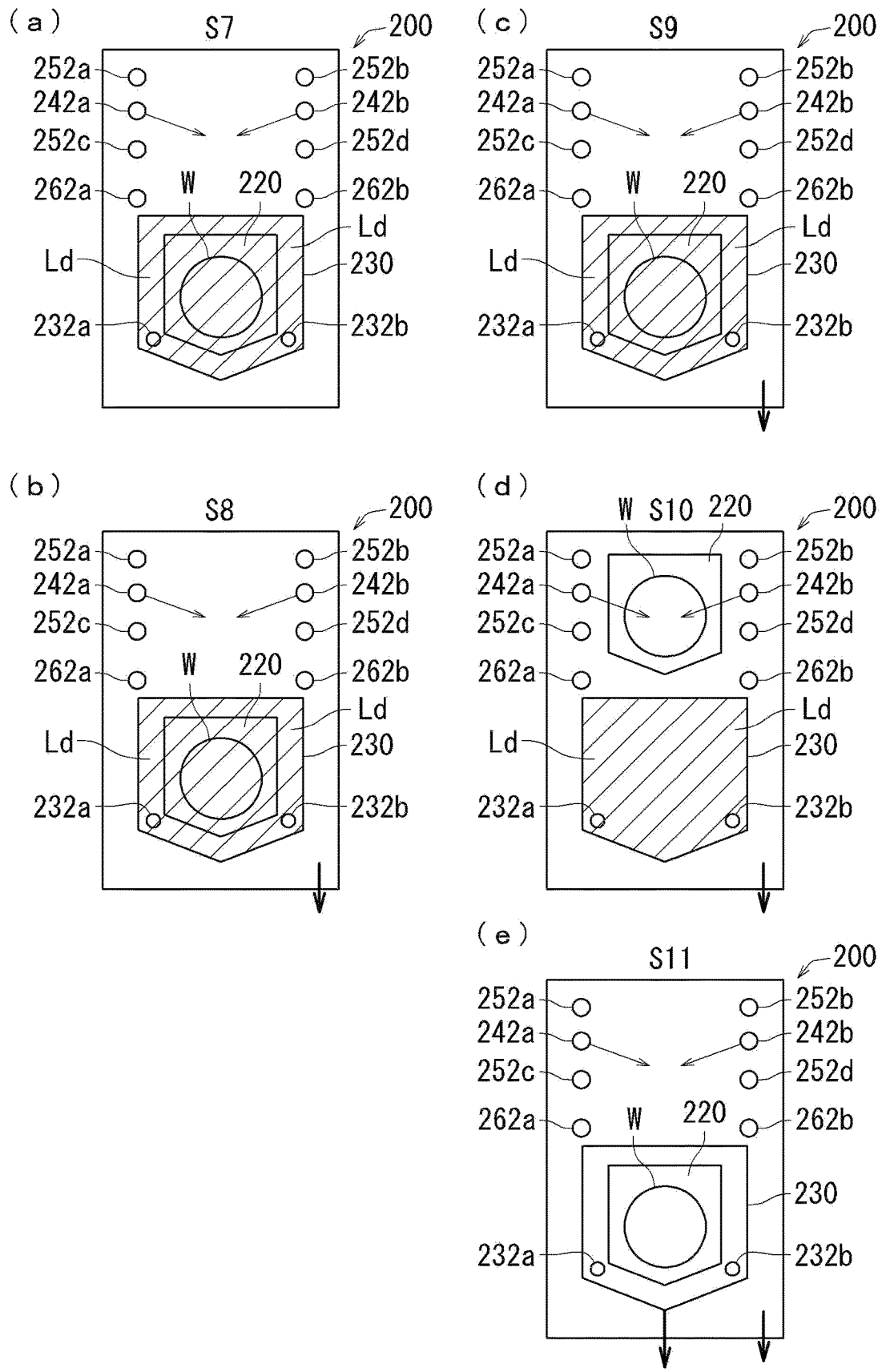

(a) to (e) of FIG. 11 are schematic explanatory views of a flow of drying treatment performed by the substrate treatment apparatus of the present embodiment.

Figure 12:
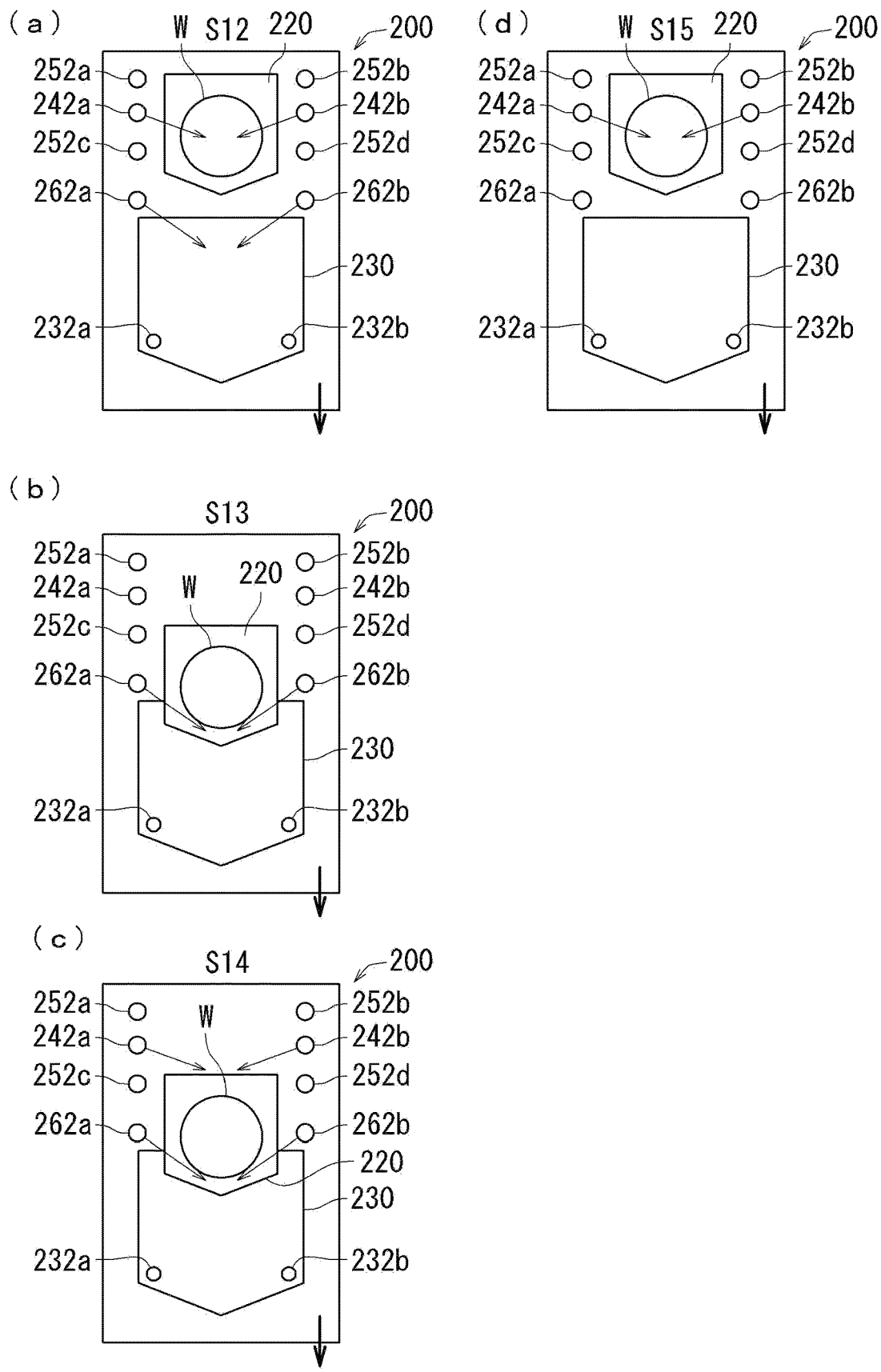

(a) to (d) of FIG. 12 are schematic explanatory views of a flow of drying treatment performed by the substrate treatment apparatus of the present embodiment.

Figure 13:
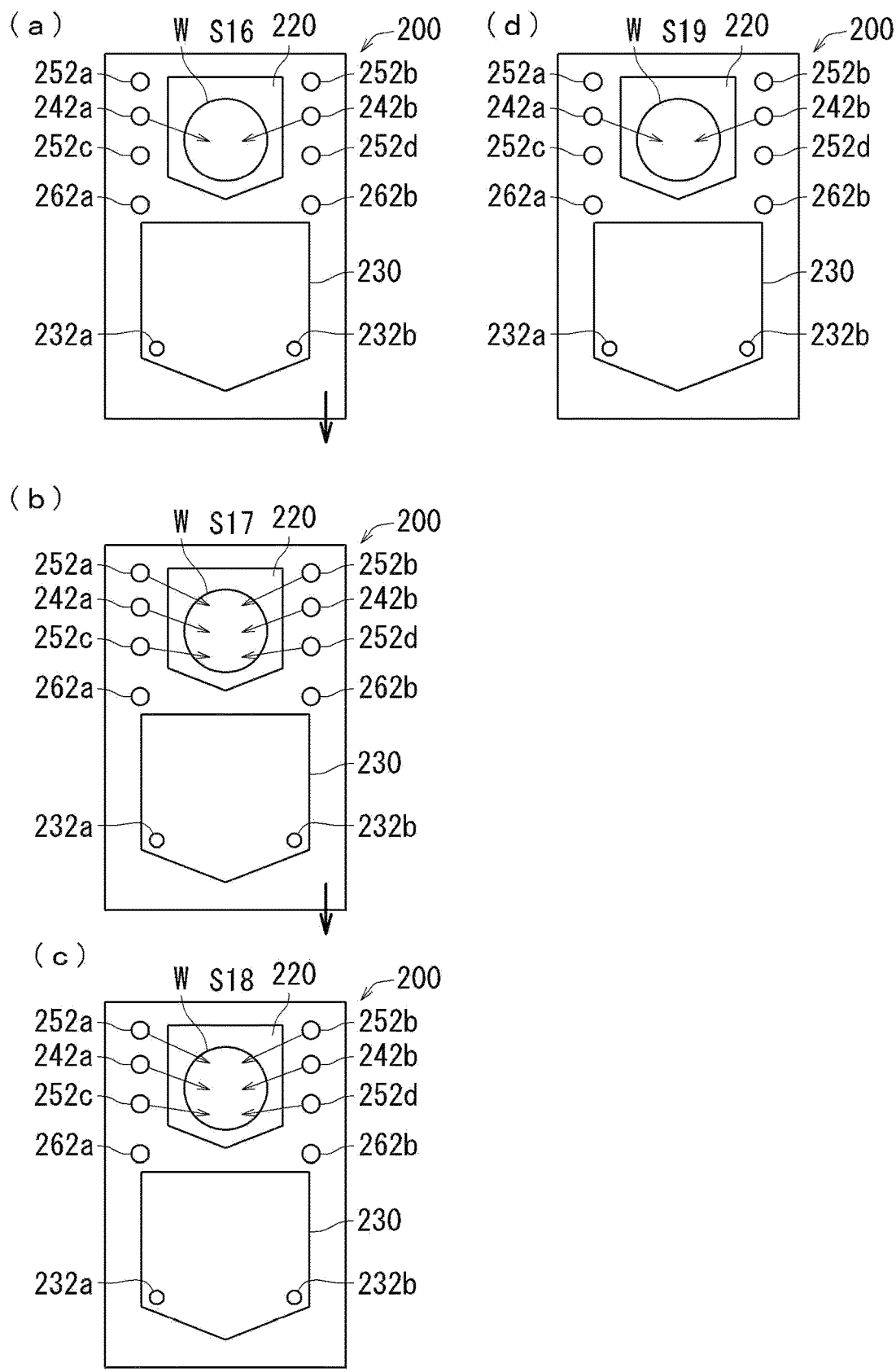

(a) to (d) of FIG. 13 are schematic explanatory views of a flow of drying treatment performed by the substrate treatment apparatus of the present embodiment.

Figure 14:
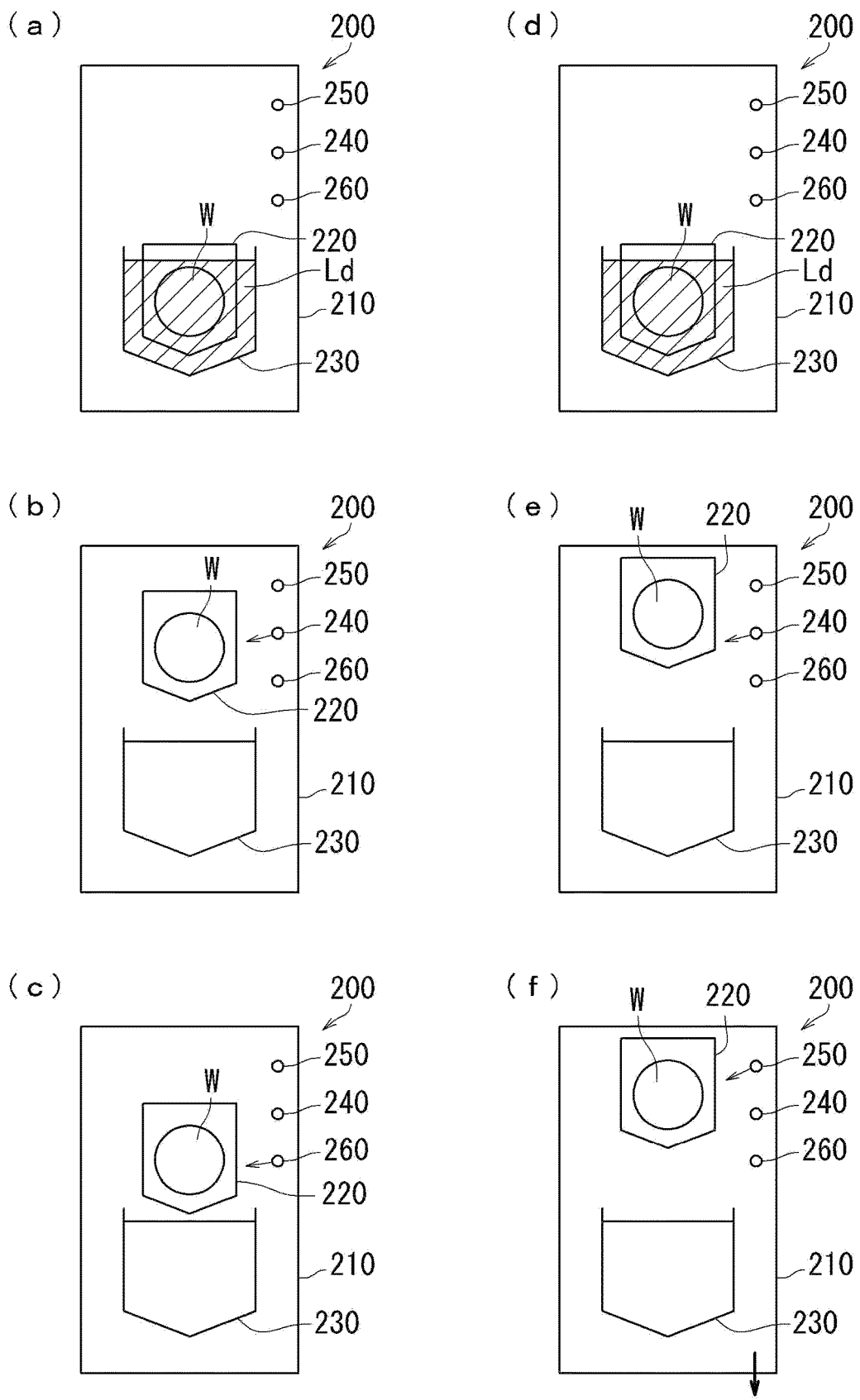

(a) to (f) of FIG. 14 are schematic explanatory views of drying treatment performed by the third treatment device in the substrate treatment apparatus of the present embodiment.

Figure 15:
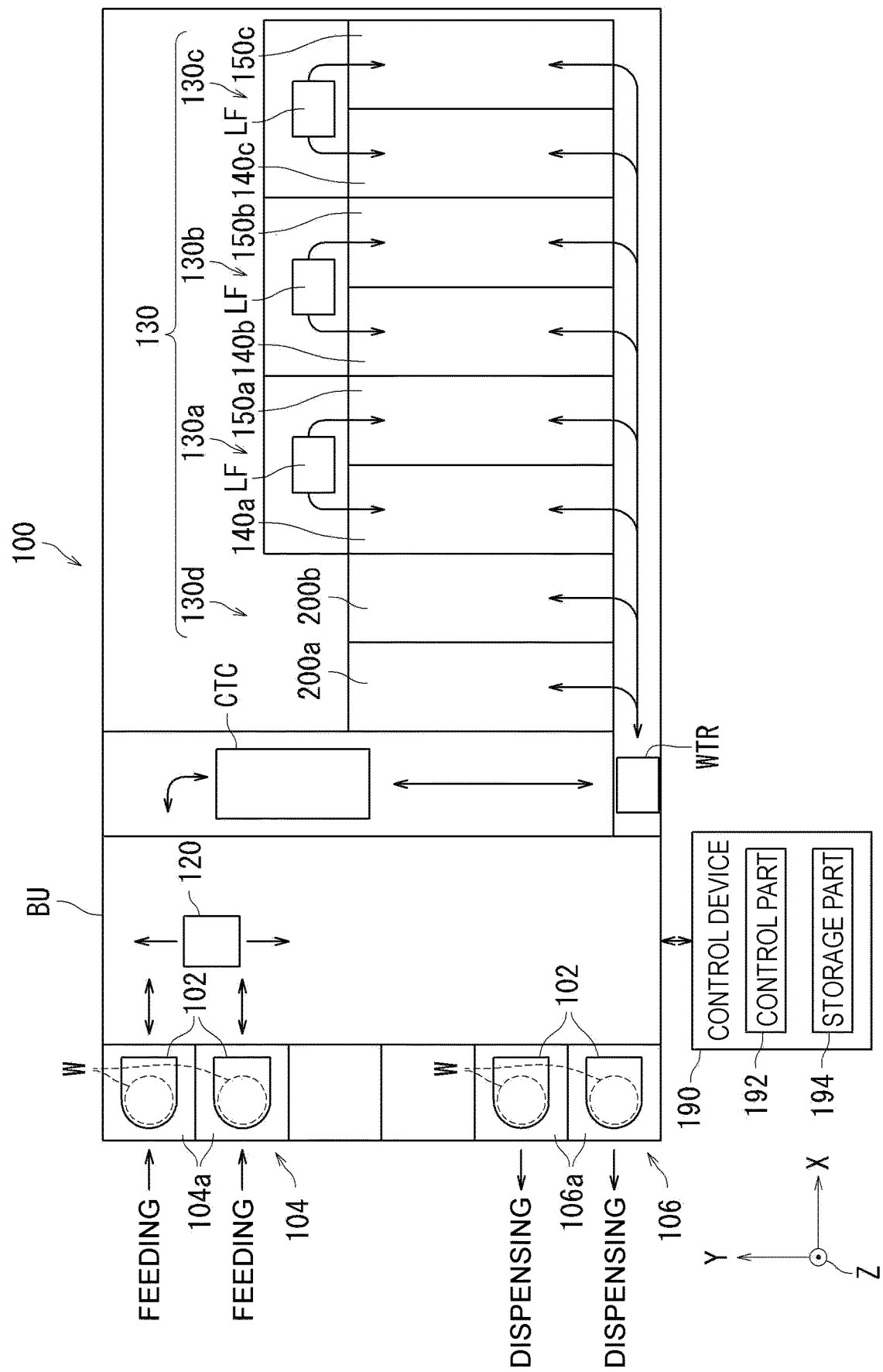

FIG. 15 is a schematic view of the substrate treatment apparatus of the present embodiment.

DESCRIPTION OF THE EMBODIMENT

Hereinafter, a substrate treatment apparatus and a substrate treatment method according to the present embodiment will be described with reference to the drawings. In the diagrams, the same reference signs are applied to portions which are the same or corresponding, and description thereof will not be repeated. In this specification of the application, in order to facilitate the understanding of the present embodiment, an X axis, a Y axis, and a Z axis which are orthogonal to each other may be indicated. Typically, the X axis and the Y axis are parallel to a horizontal direction, and the Z axis is parallel to a vertical direction.

Figure 1:
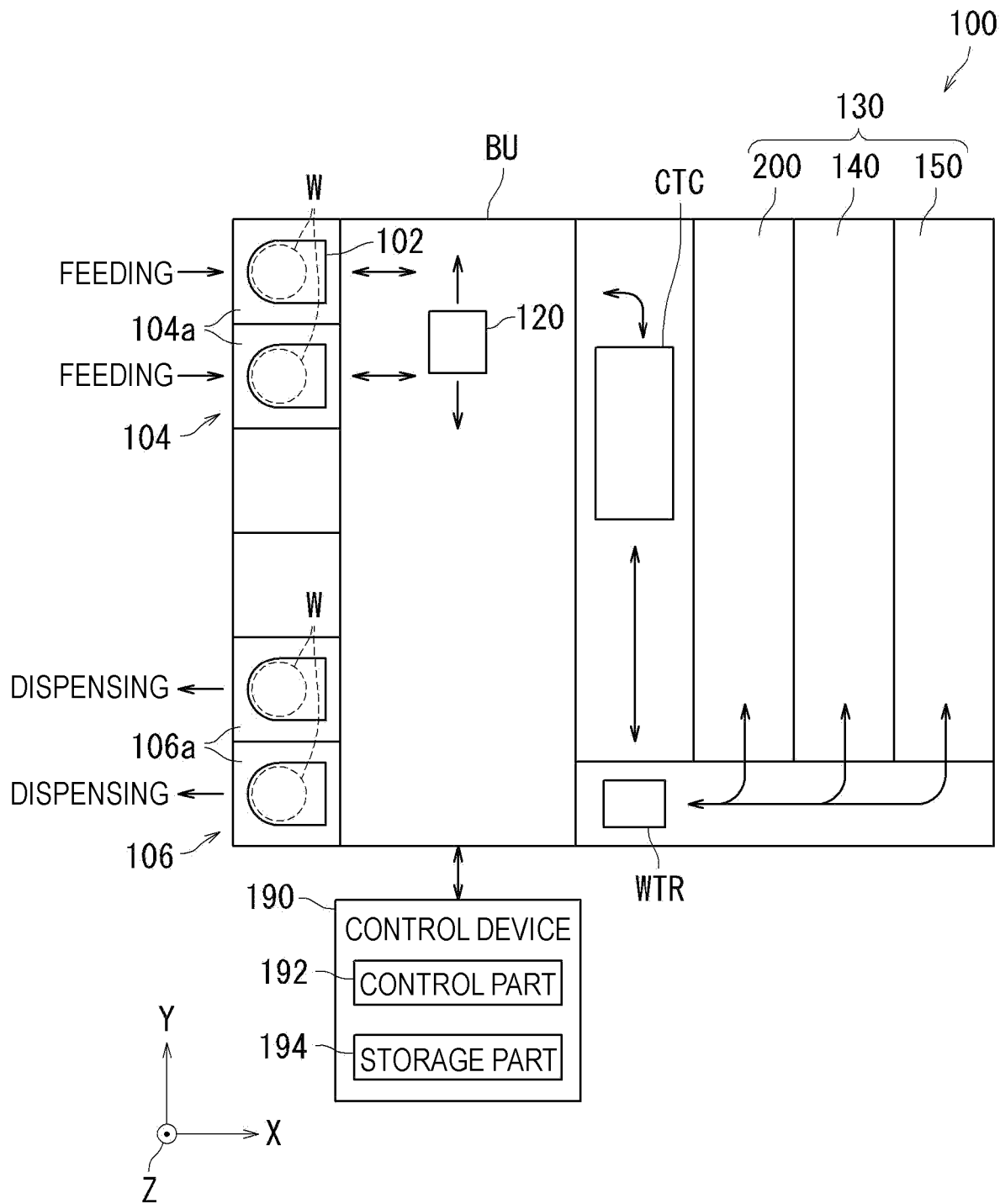
FIG. 1 is a schematic view of a substrate treatment apparatus of the present embodiment.

With reference to FIG. 1, a substrate treatment apparatus 100 according to the present embodiment will be described. FIG. 1 is a schematic view of the substrate treatment apparatus 100 of the present embodiment.

The substrate treatment apparatus 100 performs treatment of a substrate W. The substrate treatment apparatus 100 performs treatment of the substrate W such that at least one of etching, surface treatment, characterization, formation of a treatment film, and removal and cleaning of at least a portion of a film is performed with respect to the substrate W.

The substrate W has a thin plate shape. Typically, the substrate W has substantially a thin disk shape. Examples of the substrate W include a semiconductor wafer, a substrate for a liquid crystal display device, a substrate for a plasma display, a substrate for a field emission display (FED), a substrate for an optical disc, a substrate for a magnetic disk, a substrate for a magneto-optical disk, a substrate for a photomask, a ceramic substrate, and a substrate for a solar battery. For example, the substrate W has a pattern for forming a three-dimensional flash memory (for example, a three-dimensional NAND flash memory). In the following description, as an example, the substrate W is a semiconductor wafer.

The substrate treatment apparatus 100 collectively performs treatment of a plurality of substrates W. The substrate treatment apparatus 100 may perform treatment of many substrates W by treating a predetermined number of substrates W at a time. A predetermined number is an integer of 1 or larger. Here, the substrate treatment apparatus 100 collectively performs treatment of a plurality of substrates W. Specifically, the substrate treatment apparatus 100 performs treatment of a plurality of substrates W in units of a lot. For example, one lot is constituted of 25 substrates W. The number of substrates W in one lot may be 50 or 100.

For example, the substrate treatment apparatus 100 performs etching treatment of a silicon oxide film ($SiO_2$ film) or a silicon nitride film (SiN film) with respect to a surface of the substrate W (silicon substrate) on a pattern formation side. In such etching treatment, either of the silicon oxide film or the silicon nitride film is removed from the surface of the substrate W.

As illustrated in FIG. 1, the substrate treatment apparatus 100 includes a plurality of storing parts 102, a feeding part 104, a dispensing part 106, a delivering mechanism 120, a buffer unit BU, a first conveyance device CTC, a second conveyance device WTR, a treatment part 130, and a control device 190.

The treatment part 130 includes a first treatment device 140, a second treatment device 150, and a third treatment device 200. The first treatment device 140, the second treatment device 150, and the third treatment device 200 are disposed side by side in one direction. For example, the first treatment device 140, the second treatment device 150, and the third treatment device 200 are disposed in the order of the third treatment device 200, the first treatment device 140, and the second treatment device 150 from a side closer to a conveyance path of the first conveyance device CTC while being adjacent to the conveyance path of the first conveyance device CTC. For this reason, the first treatment device 140 is positioned between the second treatment device 150 and the third treatment device 200.

Here, the first treatment device 140 performs chemical solution treatment with respect to the substrates W, the second treatment device 150 performs rinse treatment with respect to the substrates W, and the third treatment device 200 performs drying treatment with respect to the substrates W.

Each of the plurality of storing parts 102 accommodates a plurality of substrates W. Each of the substrates W is accommodated in the storing part 102 in a horizontal posture. For example, the storing part 102 is a front opening unified pod (FOUP).

The storing part 102 placed in the feeding part 104 stores the substrates W which have not been treated by the treatment part 130. The feeding part 104 includes a plurality of placement bases 104a. Here, two storing parts 102 are respectively placed in two placement bases 104a.

The storing part 102 placed in the dispensing part 106 stores the substrates W which have been treated by the treatment part 130. The dispensing part 106 includes a plurality of placement bases 106a. Two storing parts 102 are respectively placed in two placement bases 106a. The dispensing part 106 stores the treated substrates W in the storing part 102 and dispenses the storing part 102 in its entirety.

The buffer unit BU is disposed adjacent to the feeding part 104 and the dispensing part 106. The buffer unit BU entirely takes in the storing part 102 placed in the feeding part 104 with the substrates W therein and places the storing part 102 in a rack (not illustrated). In addition, the buffer unit BU receives the treated substrates W, stores the substrates W in the storing part 102, and places the storing part 102 in the rack. The delivering mechanism 120 is disposed inside the buffer unit BU.

The delivering mechanism 120 delivers the storing part 102 between the feeding part 104 and the dispensing part 106, and the rack. In addition, the delivering mechanism 120 performs delivering of only the substrates W with respect to the first conveyance device CTC. Namely, the delivering mechanism 120 performs delivering of a lot of the substrates W with respect to the first conveyance device CTC.

The first conveyance device CTC receives a lot of a plurality of untreated substrates W from the delivering mechanism 120, then converts postures of the plurality of substrates W into vertical postures from horizontal postures, and delivers the plurality of substrates W to the second conveyance device WTR. In addition, the first conveyance device CTC receives a lot of a plurality of treated substrates W from the second conveyance device WTR, then converts the postures of the plurality of substrates W into horizontal postures from vertical postures, and delivers the lot of the substrates W to the delivering mechanism 120.

The second conveyance device WTR can move from the third treatment device 200 to the second treatment device 150 in a longitudinal direction of the substrate treatment apparatus 100. The second conveyance device WTR can carry in and carry out a lot of the substrates W with respect to the first treatment device 140, the second treatment device 150, and the third treatment device 200.

The first treatment device 140 includes a treatment tank (not illustrated in FIG. 1) for storing a chemical solution. The first treatment device 140 performs chemical solution treatment of a plurality of substrates W by causing the substrates W to be immersed in the chemical solution stored in the treatment tank.

Examples of the chemical solution include a dilute hydrofluoric acid (DHF), a hydrofluoric acid (HF), a fluoronitric acid (a liquid mixture of a hydrofluoric acid and a nitric acid ($HNO_3$)), a buffered hydrofluoric acid (BHF), an ammonium fluoride, an HFEG (a liquid mixture of a hydrofluoric acid and an ethylene glycol), a phosphoric acid ($H_3PO_4$), a sulfuric acid, an acetic acid, a nitric acid, a hydrochloric acid, ammonia water, a hydrogen peroxide solution, an organic acid (for example, a citric acid or an oxalic acid), an organic alkali (for example, TMAH: tetramethylammonium hydroxide), a sulfuric acid-hydrogen peroxide solution mixture (SPM), an ammonia-hydrogen peroxide solution mixture (SC1), a hydrochloric acid-hydrogen peroxide solution mixture (SC2), an isopropyl alcohol (IPA), a surfactant, a corrosion inhibitor, and a hydrophobic agent.

The second treatment device 150 is disposed adjacent to the first treatment device 140. The second treatment device 150 includes a treatment tank (not illustrated in FIG. 1) for storing a rinse liquid. The second treatment device 150 performs rinse treatment of a plurality of substrates W by causing the substrates W to be immersed in the rinse liquid stored in the treatment tank.

The rinse liquid is any of pure water (DIW: deionized water), carbonated water, electrolytically ionized water, hydrogen water, ozone water, and hydrochloric acid water having a diluted concentration (for example, approximately 10 ppm to 100 ppm). For example, pure water is deionized water.

The third treatment device 200 stores a lot of a plurality of substrates W and performs drying treatment with respect to the plurality of substrates W. The third treatment device 200 dries the substrates W by supplying an IPA and a water repellent agent to the substrates. An example of the third treatment device 200 will be described below.

The control device 190 controls various kinds of operation of the substrate treatment apparatus 100. In detail, the control device 190 controls the delivering mechanism 120, the first conveyance device CTC, the second conveyance device WTR, and the treatment part 130. For example, the control device 190 is a computer.

The control device 190 includes a control part 192 and a storage part 194. The control part 192 has a processor. For example, the control part 192 has a central processing unit (CPU). Alternatively, the control part 192 may have a general-purpose processing unit.

The storage part 194 stores data and computer programs. The data includes recipe data. The recipe data includes information indicating a plurality of recipes. Each of the plurality of recipes stipulates details of treatment and a treatment procedure of the substrates W.

The storage part 194 includes a main storage device and an auxiliary storage device. For example, the main storage device is a semiconductor memory. For example, the auxiliary storage device is a semiconductor memory and/or a hard disk drive. The storage part 194 may include a removable medium. The storage part 194 corresponds to an example of a non-transitory computer readable storage medium.

The computer programs of which the procedure is set in advance are stored in the storage part 194. The substrate treatment apparatus 100 operates in accordance with the procedure set in the computer programs. The control part 192 executes operation of substrate treatment by executing the computer programs stored in the storage part 194. The processor of the control part 192 controls the delivering mechanism 120, the first conveyance device CTC, the second conveyance device WTR, and the treatment part 130 by executing the computer programs stored in the storage part 194.

Figure 2:
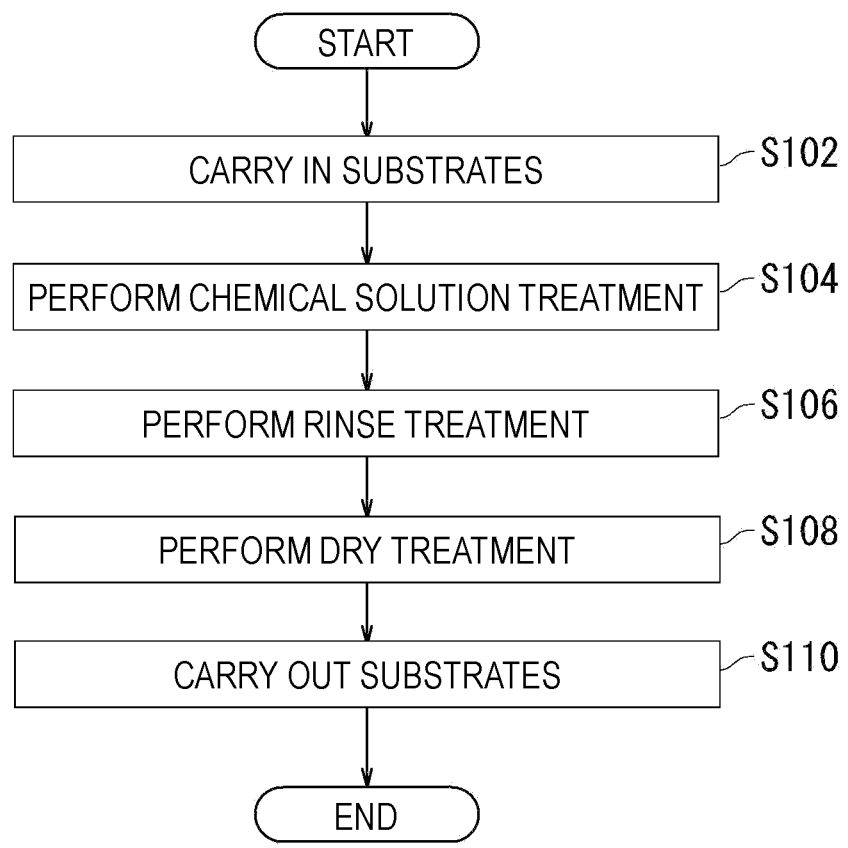
FIG. 2 is a flowchart of substrate treatment performed by a substrate treatment method of the present embodiment.

Next, with reference to FIGS. 1 and 2, a flow of substrate treatment in the substrate treatment apparatus 100 of the present embodiment will be described. FIG. 2 is a flowchart of substrate treatment in the substrate treatment apparatus 100.

As illustrated in FIG. 2, in Step S102, the substrates W are carried in. For example, the storing part 102 storing untreated substrates W is placed in the feeding part 104. The delivering mechanism 120 receives the storing part 102 placed in the feeding part 104, takes out a lot of the substrates W from the storing part 102, and delivers the lot of the substrates W to the first conveyance device CTC. The first conveyance device CTC delivers the received lot of the substrates W to the second conveyance device WTR.

In Step S104, chemical solution treatment is performed with respect to the substrates W. For example, the second conveyance device WTR carries in a plurality of substrates W to the first treatment device 140. The first treatment device 140 causes the substrates W to be immersed in the chemical solution stored in the treatment tank, thereby performing treatment of the substrates W with the chemical solution. Thereafter, the second conveyance device WTR carries out the plurality of substrates W from the first treatment device 140.

In Step S106, rinse treatment is performed with respect to the substrates W. For example, the second conveyance device WTR carries in a plurality of substrates W to the second treatment device 150. The second treatment device 150 causes the substrates W to be immersed in the rinse liquid stored in the treatment tank, thereby performing treatment of the substrates W with the rinse liquid. Thereafter, the second conveyance device WTR carries out the plurality of substrates W from the second treatment device 150.

In Step S108, drying treatment is performed with respect to the substrates W. For example, the second conveyance device WTR carries in a plurality of substrates W to the third treatment device 200. The third treatment device 200 performs drying treatment with respect to the substrates W. Thereafter, the second conveyance device WTR carries out the plurality of substrates W from the third treatment device 200.

In Step S110, when the second conveyance device WTR delivers the lot of a plurality of treated substrates W to the first conveyance device CTC, the first conveyance device CTC converts the postures of the plurality of substrates W into horizontal postures from vertical postures and delivers the substrates W to the delivering mechanism 120. The delivering mechanism 120 stores the substrates W in the storing part 102 and delivers the storing part 102 to the dispensing part 106. Thereafter, the dispensing part 106 dispenses the storing part 102 storing the treated substrates W in its entirety.

According to the substrate treatment apparatus 100 of the present embodiment, chemical solution treatment, rinse treatment, and drying treatment can be sequentially executed with respect to a plurality of substrates W.

With reference to (a) and (b) of FIG. 3, the first treatment device 140 will be described. (a) and (b) of FIG. 3 are schematic perspective views of the first treatment device 140 in the substrate treatment apparatus 100 of the present embodiment. (a) and (b) of FIG. 3 are schematic perspective view of the first treatment device 140 of the present embodiment. (a) of FIG. 3 is a schematic perspective view before the substrates W are immersed in a chemical solution L1 inside a treatment tank 142, and (b) of FIG. 3 is a schematic perspective view after the substrates W are immersed in the chemical solution L1 inside the treatment tank 142.

The chemical solution L1 may contain a phosphoric acid ($H_3PO_4$). Examples of the chemical solution L1 include a phosphoric acid aqueous solution, a liquid which is a phosphoric acid aqueous solution containing an additive, a mixed acid containing a phosphoric acid, and a mixed acid containing a phosphoric acid and an additive. For example, when a solution in which a phosphoric acid (($H_3PO_4$) of substantially 89 mass % and water (deionized water) of substantially 11 mass % are mixed at substantially 157° C. is used as the chemical solution L1 (which will hereinafter be described as "a phosphoric acid solution"), the silicon nitride film (SiN film) is removed from the surfaces of the substrates W. In other words, a solution containing no impurities and having a high temperature and a high acid concentration is used as the chemical solution L1, and the chemical solution L1 dissolves the silicon ($Si^4+$). As long as the substrates W can be treated, the kind of the chemical solution L1 is not particularly limited. In addition, the temperature of the chemical solution L1 is also not particularly limited.

The first treatment device 140 includes the treatment tank 142, a substrate holding part 144, and a chemical solution supply part 146. The treatment tank 142 stores the chemical solution L1 for performing treatment of the substrates W. The chemical solution supply part 146 supplies the chemical solution L1 to the treatment tank 142.

The substrate holding part 144 holds the substrates W. A normal direction of main surfaces of the substrates W held by the substrate holding part 144 is parallel to a Y direction. A plurality of substrates W is arranged in a row in the Y direction. In other words, a plurality of substrates W is arranged substantially parallel to the horizontal direction. In addition, a normal line of each of the plurality of substrates W extends in the Y direction, and each of the plurality of substrates W extends in an X direction and a Z direction. The substrate holding part 144 moves the substrates W while holding the substrates W. For example, the substrate holding part 144 moves vertically upward or vertically downward in the vertical direction while holding the substrates W.

Typically, the substrate holding part 144 collectively holds a plurality of substrates W. Here, the substrate holding part 144 holds the substrates W arranged in a row in the Y direction in a substrate row.

Specifically, the substrate holding part 144 includes a lifter. The substrate holding part 144 moves vertically upward or vertically downward in a state of holding a plurality of substrates W. When the substrate holding part 144 moves vertically downward, the plurality of substrates W held by the substrate holding part 144 is immersed in the chemical solution L1 stored in the treatment tank 142.

In (a) of FIG. 3, the substrate holding part 144 is positioned above the treatment tank 142. The substrate holding part 144 moves vertically downward (in the Z direction) while holding the plurality of substrates W. Accordingly, the plurality of substrates W is fed to the treatment tank 142.

As illustrated in (b) of FIG. 3, when the substrate holding part 144 moves downward to the treatment tank 142, the plurality of substrates W is immersed in the chemical solution L1 inside the treatment tank 142. The substrate holding part 144 causes the plurality of substrates W lined up at predetermined intervals to be immersed in the chemical solution L1 stored in the treatment tank 142.

The substrate holding part 144 includes a main body plate 144a and holding rods 144b. The main body plate 144a is a plate extending in the vertical direction (the Z direction). The holding rods 144b extend in the horizontal direction (Y direction) from a main surface of the main body plate 144a on one side. In (a) and (b) of FIG. 3, three holding rods 144b extend in the horizontal direction from the main surface of the main body plate 144a on one side. In a state in which a plurality of substrates W is lined up at predetermined intervals, a lower edge of each of the substrates W abuts the plurality of holding rods 144b and the substrates W are held in upright standing postures (vertical postures).

The substrate holding part 144 may further include an upward-downward movement unit 144c. The upward-downward movement unit 144c moves the main body plate 144a upward and downward between a lower position where a plurality of substrates W held by the holding rods 144b is positioned inside the treatment tank 142 (the position illustrated in (b) of FIG. 3) and an upper position where a plurality of substrates W held by the holding rods 144b is positioned above the treatment tank 142 (the position illustrated in (a) of FIG. 3). Therefore, when the main body plate 144a is moved to the lower position by the upward-downward movement unit 144c, a plurality of substrates W held by the holding rods 144b is immersed in the chemical solution L1.

With reference to (a) and (b) of FIG. 4, the second treatment device 150 will be described. (a) and (b) of FIG. 4 are schematic perspective views of the second treatment device 150 in the substrate treatment apparatus 100 of the present embodiment.

The second treatment device 150 includes a treatment tank 152, a substrate holding part 154, and a rinse liquid supply part 156. The treatment tank 152 stores a rinse liquid L2 for performing treatment of the substrates W. The rinse liquid supply part 156 supplies the rinse liquid L2 to the treatment tank 152.

The substrate holding part 154 holds the substrates W. The normal direction of the main surfaces of the substrates W held by the substrate holding part 154 is parallel to the Y direction. A plurality of substrates W is arranged in a row in the Y direction. In other words, a plurality of substrates W is arranged substantially parallel to the horizontal direction. In addition, the normal line of each of the plurality of substrates W extends in the Y direction, and each of the plurality of substrates W extends in the X direction and the Z direction. The substrate holding part 154 moves the substrates W while holding the substrates W. For example, the substrate holding part 154 moves vertically upward or vertically downward in the vertical direction while holding the substrates W.

Typically, the substrate holding part 154 collectively holds a plurality of substrates W. Here, the substrate holding part 154 holds the substrates W arranged in a row in the Y direction in a substrate row.

Specifically, the substrate holding part 154 includes a lifter. The substrate holding part 154 moves vertically upward or vertically downward in a state of holding a plurality of substrates W. When the substrate holding part 154 moves vertically downward, the plurality of substrates W held by the substrate holding part 154 is immersed in the rinse liquid L2 stored in the treatment tank 152.

In (a) of FIG. 4, the substrate holding part 154 is positioned above the treatment tank 152. The substrate holding part 154 moves vertically downward (in the Z direction) while holding the plurality of substrates W. Accordingly, the plurality of substrates W is fed to the treatment tank 152.

As illustrated in (b) of FIG. 4, when the substrate holding part 154 moves downward to the treatment tank 152, the plurality of substrates W is immersed in the rinse liquid L2 inside the treatment tank 152. The substrate holding part 154 causes the plurality of substrates W lined up at predetermined intervals to be immersed in the rinse liquid L2 stored in the treatment tank 152.

The substrate holding part 154 includes a main body plate 154a and holding rods 154b. The main body plate 154a is a plate extending in the vertical direction (the Z direction). The holding rods 154b extend in the horizontal direction (Y direction) from a main surface of the main body plate 154a on one side. In (a) and (b) of FIG. 4, three holding rods 154b extend in the horizontal direction from the main surface of the main body plate 154a on one side. In a state in which a plurality of substrates W is lined up at predetermined intervals, the lower edge of each of the substrates W abuts the plurality of holding rods 154b and the substrates W are held in upright standing postures (vertical postures).

The substrate holding part 154 may further include an upward-downward movement unit 154c. The upward-downward movement unit 154c moves the main body plate 154a upward and downward between the lower position where a plurality of substrates W held by the holding rods 154b is positioned inside the treatment tank 152 (the position illustrated in (b) of FIG. 4) and the upper position where a plurality of substrates W held by the holding rods 154b is positioned above the treatment tank 152 (the position illustrated in (a) of FIG. 4). Therefore, when the main body plate 154a is moved to the lower position by the upward-downward movement unit 154c, a plurality of substrates W held by the holding rods 154b is immersed in the rinse liquid L2.

Next, with reference to (a) and (b) of FIG. 5, the third treatment device 200 in the substrate treatment apparatus 100 of the present embodiment will be described. (a) and (b) of FIG. 5 are schematic views of the third treatment device 200.

As illustrated in (a) and (b) of FIG. 5, the third treatment device 200 includes a chamber 210, a substrate holding part 220, a treatment tank 230, a liquid supply part 232, an isopropyl alcohol supply part 240, an inert gas supply part 250, a water repellent agent supply part 260, and a control device 290. The control device 290 controls the substrate holding part 220, the liquid supply part 232, the isopropyl alcohol supply part 240, the inert gas supply part 250, and the water repellent agent supply part 260. Moreover, the control device 290 may control the chamber 210. In addition, the control device 290 may control the atmosphere inside the chamber 210 and/or a stored liquid L stored in the treatment tank 230. The control device 290 may function as a portion of the control device 190 illustrated in FIG. 1. Alternatively, the control device 290 may operate in association with the control device 190 illustrated in FIG. 1.

The chamber 210 has an internal space. The space of the chamber 210 is stipulated by a bottom surface, side surfaces, and a top surface. Typically, the chamber 210 has a closed structure. At least some of the substrate holding part 220, the treatment tank 230, the liquid supply part 232, the IPA supply part 240, the inert gas supply part 250, and the water repellent agent supply part 260 are disposed inside the chamber 210.

The chamber 210 has a main body part 212 and a cover 214. The space of the main body part 212 is stipulated by a bottom surface, side surfaces, and a top surface. The top surface of the main body part 212 is partially open. The open portion of the main body part 212 is covered by the cover 214. When the substrates W are fed to the chamber 210, or when the substrates W are taken out from the chamber 210, the cover 214 moves with respect to the main body part 212 so that a passage for the substrates W is formed.

The substrate holding part 220 holds the substrates W. The normal direction of the main surfaces of the substrates W held by the substrate holding part 220 is parallel to the Y direction. A plurality of substrates W is arranged in a row in the Y direction. In other words, a plurality of substrates W is arranged substantially parallel to the horizontal direction. In addition, the normal line of each of the plurality of substrates W extends in the Y direction, and each of the plurality of substrates W extends in the X direction and the Z direction. The substrate holding part 220 moves the substrates W while holding the substrates W. For example, the substrate holding part 220 moves vertically upward or vertically downward in the vertical direction while holding the substrates W.

Typically, the substrate holding part 220 collectively holds a plurality of substrates W. Here, the plurality of substrates W forms a substrate row in which the substrates W are arranged side by side in a row in the Y direction. For this reason, the substrate holding part 220 holds the plurality of substrates W arranged in a substrate row. The substrate holding part 220 may hold only one substrate W.

Specifically, the substrate holding part 220 includes a lifter. The substrate holding part 220 moves vertically upward or vertically downward in a state of holding a plurality of substrates W. When the substrate holding part 220 moves vertically downward, the plurality of substrates W held by the substrate holding part 220 is immersed in the stored liquid L stored in the treatment tank 230.

As illustrated in (a) of FIG. 5, the substrate holding part 220 is positioned above the treatment tank 230. As illustrated in (b) of FIG. 5, the substrate holding part 220 moves vertically downward (in the Z direction) while holding the plurality of substrates W. Accordingly, the plurality of substrates W is fed to the treatment tank 230.

When the treatment tank 230 stores the stored liquid L, if the substrate holding part 220 moves downward to the treatment tank 230 while holding the substrates W, the plurality of substrates W is immersed in the stored liquid L inside the treatment tank 230. The substrate holding part 220 causes the plurality of substrates W lined up at predetermined intervals to be immersed in the stored liquid L stored in the treatment tank 230.

The substrate holding part 220 has a main body plate 222 and holding rods 224. The main body plate 222 is a plate extending in the vertical direction (the Z direction). The holding rods 224 extend in the horizontal direction (Y direction) from a main surface of the main body plate 222 on one side. In (a) and (b) of FIG. 5, three holding rods 224 extend in the horizontal direction from the main surface of the main body plate 222 on one side. In a state in which a plurality of substrates W is lined up at predetermined intervals, the lower edge of each of the substrates W abuts the plurality of holding rods 224 and the substrates W are held in upright standing postures (vertical postures).

The substrate holding part 220 may further include an upward-downward movement unit 226. The upward-downward movement unit 226 moves the main body plate 222 upward and downward between the lower position where a plurality of substrates W held by the holding rods 224 is positioned inside the treatment tank 230 (the position illustrated in (b) of FIG. 5) and the upper position where a plurality of substrates W held by the holding rods 224 is positioned above the treatment tank 230 (the position illustrated in (a) of FIG. 5). Therefore, when the main body plate 222 is moved to the lower position by the upward-downward movement unit 226, a plurality of substrates W held by the holding rods 224 is immersed in the stored liquid L.

The treatment tank 230 stores the stored liquid L for performing treatment of the substrates W. The treatment tank 230 stores the stored liquid L. In a state in which the treatment tank 230 stores the stored liquid L, when the substrate holding part 220 causes the substrates W to be immersed in the stored liquid L in the treatment tank 230, the substrates W can be treated with the stored liquid L. For example, the capacity of the treatment tank 230 is within a range of 5 L to 100 L.

The stored liquid L may be water. As an example, the stored liquid L may be deionized water (DIW). In addition, the stored liquid L may be an isopropyl alcohol (IPA). In addition, the stored liquid L may be a liquid mixture of a rinse liquid and an IPA.

In this specification, a diluted IPA obtained by mixing an IPA and a rinse liquid may be described as a dilute IPA. For example, a dilute IPA may be generated by mixing an IPA and a rinse liquid in a proportion of the volume ratio 1:1 to 1:1000. Hereinafter, a dilute IPA may be described as "a dIPA".

For example, a dilute IPA is an IPA diluted with DIW. In this case, a dilute IPA is a liquid mixture of an IPA and DIW.

The liquid supply part 232 supplies a liquid to the treatment tank 230. By means of supply of a liquid from the liquid supply part 232, the treatment tank 230 stores the stored liquid L.

For example, the liquid supply part 232 may supply water. As an example, the liquid supply part 232 may supply DIW. In addition, the liquid supply part 232 may supply an isopropyl alcohol (IPA). In addition, the liquid supply part 232 may supply a liquid mixture of a rinse liquid and an IPA.

Typically, the liquid supply part 232 is disposed in the treatment tank 230. For example, the liquid supply part 232 is disposed below the treatment tank 230. The liquid supply part 232 is positioned on the vertically downward side of the substrates W immersed in the stored liquid L in the treatment tank 230 due to downward movement of the substrate holding part 220.

The liquid supply part 232 supplies a liquid to the treatment tank 230. In detail, the liquid supply part 232 supplies the stored liquid L stored in the treatment tank 230. When the liquid supply part 232 supplies the stored liquid L in the treatment tank 230, the treatment tank 230 can store the stored liquid L. It is preferable that the liquid supply part 232 supply a liquid obliquely upward with respect to the treatment tank 230.

A gas may be supplied to the treatment tank 230. For example, when an inert gas is supplied to the stored liquid L in the treatment tank 230, treatment of the substrates W with the stored liquid L is promoted.

The isopropyl alcohol supply part 240 supplies vapor of an isopropyl alcohol to the inside of the chamber 210. In this specification, an isopropyl alcohol may be described as an IPA, and the isopropyl alcohol supply part 240 may be described as the IPA supply part 240.

The IPA supply part 240 supplies vapor of an IPA to the substrates W positioned above the treatment tank 230. Accordingly, the substrates W can be treated with the IPA. The IPA supply part 240 may supply vapor of an IPA obliquely downward.

The inert gas supply part 250 supplies an inert gas to the inside of the chamber 210. When the inert gas supply part 250 supplies the inert gas to the inside of the chamber 210, the inside of the chamber 210 can be in the inert gas atmosphere. Accordingly, the oxygen concentration inside the chamber 210 can be reduced. In addition, since the inert gas supply part 250 supplies the inert gas to the inside of the chamber 210, a reverse flow of a discharged gas and a discharged liquid from the chamber 210 can be curbed. The inert gas supply part 250 may supply the inert gas obliquely downward.

Moreover, the inert gas supply part 250 supplies the inert gas to the substrates W positioned above the treatment tank 230. Accordingly, the substrates W can be subjected to drying treatment.

The inert gas includes a nitrogen gas. Alternatively, the inert gas may include an argon gas.

The water repellent agent supply part 260 supplies vapor of a water repellent agent SMT to the inside of the chamber 210. The water repellent agent supply part 260 supplies vapor of the water repellent agent SMT to the substrates W positioned above the treatment tank 230. Accordingly, the substrates W can be subjected to water-repellent treatment. The water repellent agent supply part 260 may supply vapor of the water repellent agent SMT obliquely downward.

For example, the water repellent agent SMT is a silicon-based water repellent agent, or a metal-based water repellent agent. A silicon-based water repellent agent causes a silicon or a chemical compound including a silicon to be water repellent (hydrophobic). A metal-based water repellent agent causes a metal or a chemical compound including a metal to be water repellent (hydrophobic).

For example, a silicon-based water repellent agent is a silane coupling agent. For example, the silane coupling agent includes at least one of a hexamethyldisilazane (HMDS), a tetramethylsilane (TMS), a fluorinated alkyl-chlorosilane, an alkyl disilazane, and a non-chlorohydrophobic agent. For example, the non-chlorohydrophobic agent includes at least one of a dimethylsilyldimethylamine, a dimethylsilyldiethylamine, a hexamethyldisilazane, a tetramethyldisilazane, a bis(dimethylamino)dimethylsilane, an N,N-dimethylaminotrimethylsilane, an N-(trimethylsilyl)dimethylamine, and an organosilane chemical compound.

For example, a metal-based water repellent agent includes at least one of an amine having a hydrophobic group and an organic silicon chemical compound.

The water repellent agent SMT may be diluted with a solvent having phase-solubility with respect to a hydrophilic organic solvent. For example, the solvent is an IPA or a propylene glycol monomethyl ether acetate (PGMEA).

Inside the chamber 210, the water repellent agent supply part 260, the IPA supply part 240, and the inert gas supply part 250 are disposed in this order from a side closer to the treatment tank 230 above the treatment tank 230.

The third treatment device 200 may further include a liquid discharge part 270. The liquid discharge part 270 discharges the stored liquid L in the treatment tank 230. The inside of the treatment tank 230 can be made empty by the liquid discharge part 270.

Next, with reference to (a) of FIG. 5 to FIG. 6, drying treatment in the substrate treatment apparatus 100 of the present embodiment will be described. FIG. 6 is a flowchart of drying treatment in the substrate treatment apparatus 100.

As illustrated in FIG. 6, in Step S202, the substrates W are immersed in a dIPA stored in the treatment tank 230. In this case, the treatment tank 230 stores a dIPA. For example, the substrate holding part 220 moves vertically downward while holding the substrates W and causes the substrates W to be immersed in the dIPA. Alternatively, the substrate holding part 220 may move vertically downward while holding the substrates W and may change the stored liquid L to a dIPA in a state in which the substrates W are immersed in the stored liquid L in the treatment tank 230. For example, in a state in which the substrates W are immersed in a rinse liquid (DIW as an example) serving as the stored liquid L in the treatment tank 230, the liquid supply part 232 can supply an IPA to the treatment tank 230 so that the stored liquid L can be changed to a dIPA in a state in which the substrates W are immersed therein.

In Step S204, the substrates W are treated with the IPA. For example, after the substrate holding part 220 moves to the upper position while holding the substrates W, the IPA supply part 240 supplies vapor of the IPA to the substrates W. Accordingly, the substrates W can be treated with the IPA. It is preferable that the substrate holding part 220 move to a position where the substrates W come into contact with a large amount of vapor of the IPA supplied from the IPA supply part 240.

In Step S206, water-repellent treatment of the substrates W is performed by supplying vapor of the water repellent agent SMT to the substrates W. For example, in a state in which the substrate holding part 220 is positioned at the upper position, the water repellent agent supply part 260 supplies vapor of the water repellent agent SMT to the substrates W. Accordingly, the substrates W can be subjected to water-repellent treatment. The substrate holding part 220 may move such that the substrates W come into contact with a large amount of vapor of the water repellent agent SMT supplied from the water repellent agent supply part 260 at the upper position.

In Step S208, the substrates W are treated with the IPA. For example, the substrate holding part 220 is positioned at the upper position. The IPA supply part 240 supplies vapor of the IPA to the substrates W. Accordingly, the substrates W can be treated with the IPA. The substrate holding part 220 may move such that the substrates W come into contact with a large amount of vapor of the IPA supplied from the IPA supply part 240 at the upper position.

In Step S210, an inert gas is supplied to the substrates W. The substrate holding part 220 is positioned at the upper position. The inert gas supply part 250 supplies the inert gas to the substrates W. Accordingly, the substrates W can be subjected to drying treatment. The substrate holding part 220 may move such that the substrates W come into contact with a large amount of the inert gas supplied from the inert gas supply part 250 at the upper position.

According to the present embodiment, after the substrates W are immersed in the dIPA, the substrates W are treated with the IPA. Thereafter, water-repellent treatment of the substrates W is performed. In this manner, since the substrates W are immersed in the dIPA, even when patterns having a relatively high aspect ratio are formed on the substrates W, the surfaces of the substrates W can be sufficiently replaced with the IPA even at fine portions in the patterns of the substrates W, and the surfaces of the substrates W can be replaced with a water repellent agent thereafter. Typically, a water repellent agent is unlikely to have affinity with a rinse liquid (for example, water). However, since the stored liquid L is a dIPA, the water repellent agent can sufficiently infiltrate throughout the entire surfaces of the substrates W. Therefore, according to the present embodiment, collapse of the patterns of the substrates W can be favorably curbed.

Next, with reference to (a) of FIG. 5 to (e) of FIG. 7, drying treatment in the substrate treatment apparatus 100 of the present embodiment will be described. (a) to (e) of FIG. 7 are schematic views illustrating a flow of drying treatment in the substrate treatment apparatus 100.

As illustrated in (a) of FIG. 7, the substrates W are immersed in a dIPA stored in the treatment tank 230. In this specification, when the stored liquid L stored in the treatment tank 230 is a dIPA, the stored liquid L may be indicated as a stored liquid Ld.

For example, when the substrate holding part 220 is positioned at the upper position of the chamber 210, the stored liquid Ld is stored in the treatment tank 230. Thereafter, the substrate holding part 220 receives the substrates W. Typically, the substrates W received by the substrate holding part 220 are subjected to rinse treatment with a rinse liquid (for example, DIW). Thereafter, the substrate holding part 220 moves downward from above the chamber 210 so that the substrates W are immersed in the stored liquid Ld stored in the treatment tank 230.

While the substrates W are immersed in the stored liquid Ld which has been stored, the concentration of the stored liquid Ld may be increased. For example, the concentration of the stored liquid Ld can be increased by causing the liquid supply part 232 to further supply an IPA to the stored liquid Ld in the treatment tank 230. For example, if the immersion time of the substrates W exceeds a threshold, the concentration of the stored liquid Ld may be higher than that when the immersion time is equal to or shorter than the threshold. Alternatively, the concentration of the stored liquid Ld may be continuously increased together with the immersion time of the substrates W.

As illustrated in (b) of FIG. 7, IPA treatment of the substrates W is performed by supplying vapor of an IPA to the substrates W. In detail, after the substrate holding part 220 moves to the upper position while holding the substrates W, the IPA supply part 240 supplies vapor of the IPA to the substrates W. Accordingly, the substrates W can be treated with the IPA. Here, the stored liquid Ld in the treatment tank 230 is discharged.

As illustrated in (c) of FIG. 7, water-repellent treatment of the substrates W is performed by supplying vapor of the water repellent agent SMT to the substrates W. While the substrate holding part 220 is positioned at the upper position, the water repellent agent supply part 260 supplies vapor of the water repellent agent SMT to the substrates W. Accordingly, the substrates W can be subjected to water-repellent treatment.

As illustrated in (d) of FIG. 7, IPA treatment of the substrates W is performed by supplying vapor of an IPA to the substrates W. While the substrate holding part 220 is positioned at the upper position, the IPA supply part 240 supplies vapor of the IPA to the substrates W. Accordingly, the substrates W can be treated with the IPA.

As illustrated in FIG. 7E, the inert gas is supplied to the substrates W. While the substrate holding part 220 is positioned at the upper position, the inert gas supply part 250 supplies the inert gas to the substrates W. Accordingly, the substrates W can be dried.

According to the substrate treatment apparatus 100 of the present embodiment, after the substrates W are immersed in the dIPA, the substrates W are subjected to IPA treatment. Thereafter, the water repellent agent SMT is supplied to the substrates W. For this reason, since the IPA can be caused to adhere to the entire surfaces of the substrates W before the water repellent agent SMT is supplied, the entire surfaces of the substrates W can be thoroughly replaced with the water repellent agent SMT by supplying the water repellent agent SMT. Therefore, while collapse of the patterns of the substrates W is curbed, a chemical solution and/or a rinse liquid which has adhered to the substrates W can be sufficiently dried.

In addition, as illustrated in (d) to (e) of FIG. 7, the substrate holding part 220 may move at the upper position while holding the substrates W in accordance with supply of vapor or gas from any of the IPA supply part 240, the inert gas supply part 250, and the water repellent agent supply part 260. Accordingly, while the IPA supply part 240, the inert gas supply part 250, and the water repellent agent supply part 260 are fixedly disposed, the substrates W can be efficiently treated utilizing vapor or gas supplied from the IPA supply part 240, the inert gas supply part 250, and the water repellent agent supply part 260.

Next, with reference to FIGS. 8 and 9, the third treatment device 200 in the substrate treatment apparatus 100 of the present embodiment will be described. FIG. 8 is a schematic view of the third treatment device 200.

Each of the substrates W has a pattern formation surface on which a pattern is formed. A pattern is formed on a surface of the substrate W through wet etching treatment. As described above with reference to FIG. 1, in addition to the third treatment device 200, the substrate treatment apparatus 100 includes the first treatment device 140 and the second treatment device 150. For example, after the substrate W is etched by the first treatment device 140, the substrate W is subjected to rinse treatment by the second treatment device 150. Thereafter, the substrate W is conveyed to (carried into) the third treatment device 200.

As illustrated in FIG. 8, the third treatment device 200 includes the chamber 210, the substrate holding part 220, the treatment tank 230, the liquid supply part 232, the inert gas supply part 250, the water repellent agent supply part 260, and the liquid discharge part 270. At least some of the substrate holding part 220, the treatment tank 230, the liquid supply part 232, the IPA supply part 240, the inert gas supply part 250, the water repellent agent supply part 260, and the liquid discharge part 270 are accommodated in the chamber 210.

The chamber 210 has the main body part 212 and the cover 214. The cover 214 covers an opening at an upper part of the main body part 212. The cover 214 can be opened and closed with respect to the main body part 212.

An opening-closing unit 216 opens and closes the cover 214. That is, the opening-closing unit 216 switches the cover 214 between an open state and a closed state. When the cover 214 is opened and closed with respect to the main body part 212, the opening at the upper part of the chamber 210 switches between a blocked state and a released state. The opening-closing unit 216 has a drive source and an opening-closing mechanism and opens and closes the cover 214 by means of the drive source driving the opening-closing mechanism. For example, the drive source includes a motor. For example, the opening-closing mechanism includes a rack-pinion mechanism.

The substrate holding part 220 has the main body plate 222, the holding rods 224, and the upward-downward movement unit 226. The holding rods 224 are attached to the main body plate 222.

The upward-downward movement unit 226 moves the main body plate 222 and the holding rods 224 upward and downward. When the upward-downward movement unit 226 moves the main body plate 222 and the holding rods 224 upward and downward, the substrates W held by the holding rods 224 move upward and downward. The upward-downward movement unit 226 has a drive source and an upward-downward movement mechanism and moves the substrate holding part 220 upward and downward by means of the drive source driving the upward-downward movement mechanism. For example, the drive source includes a motor. For example, the upward-downward movement mechanism includes a rack-pinion mechanism or a ball screw.

The upward-downward movement unit 226 moves the main body plate 222 and the holding rods 224 upward to a place above the chamber 210 when the substrates W are carried into the chamber 210 and when the substrates W are carried out of the chamber 210. In addition, the upward-downward movement unit 226 moves the substrates W vertically downward together with the main body plate 222 and the holding rods 224 when the substrates W are immersed in the stored liquid L inside the treatment tank 230. In FIG. 8, the substrate holding part 220 and the substrates W which have moved to the lower position are indicated by the solid line, and the substrate holding part 220 and the substrates W which have moved to the upper position are indicated by the dotted line.

The control device 290 (a control part 292) switches the cover 214 between an open state and a closed state by controlling the opening-closing unit 216. Specifically, the control device 290 (the control part 292) causes the cover 214 to be in an open state when the substrates W are carried into the chamber 210 and when the substrates W are carried out of the chamber 210. When the cover 214 is in an open state, the opening at the upper part of the chamber 210 is in a released state so that the substrates W can be carried into the chamber 210 and the substrates W can be carried out of the chamber 210. The control device 290 (the control part 292) causes the cover 214 to be in a closed state at the time of treatment of the substrates W. When the cover 214 is in a closed state, the opening at the upper part of the chamber 210 is in a blocked state. As a result, the inside of the chamber 210 becomes a closed space. The substrates W are treated inside the closed space.

The treatment tank 230 stores the stored liquid L. The stored liquid L may be a dilute isopropyl alcohol (IPA). In addition, the stored liquid L may be a rinse liquid. In this manner, the treatment tank 230 stores a rinse liquid or a dilute IPA. A dilute IPA indicates a diluted IPA. For example, a rinse liquid is deionized water (DIW). In this case, a dilute IPA is an IPA diluted with DIW. In other words, a dilute IPA is a liquid mixture of an IPA and DIW.

The liquid supply part 232 supplies a stored liquid to the treatment tank 230. Specifically, the liquid supply part 232 supplies at least one of a rinse liquid (DIW) and an IPA to the treatment tank 230. The liquid supply part 232 has a nozzle 232a and a nozzle 232b. The nozzle 232a and the nozzle 232b are disposed inside the treatment tank 230. The nozzle 232a and the nozzle 232b are positioned parallel to the horizontal direction. The nozzle 232a and the nozzle 232b spout at least one of a rinse liquid (DIW) and an IPA into the treatment tank 230.

The IPA supply part 240 supplies vapor of the IPA to the inside of the chamber 210. The IPA supply part 240 has a nozzle 242a and a nozzle 242b. The nozzle 242a and the nozzle 242b are disposed inside the chamber 210 and outside the treatment tank 230. The nozzle 242a and the nozzle 242b are positioned parallel to the horizontal direction. The nozzle 242a and the nozzle 242b spout vapor of the IPA. The nozzle 242a and the nozzle 242b may spout not only vapor of the IPA but also the inert gas.

The inert gas supply part 250 supplies the inert gas to the inside of the chamber 210. The inert gas supply part 250 has a nozzle 252a, a nozzle 252b, a nozzle 252c, and a nozzle 252d. The nozzle 252a, the nozzle 252b, the nozzle 252c, and the nozzle 252d are disposed inside the chamber 210 and outside the treatment tank 230. The nozzle 252a and the nozzle 252b are positioned parallel to the horizontal direction, and the nozzle 252c and the nozzle 252d are positioned parallel to the horizontal direction. The nozzle 252a, the nozzle 252b, the nozzle 252c, and the nozzle 252d spout the inert gas.

The water repellent agent supply part 260 supplies vapor of a water repellent agent to the inside of the chamber 210. The water repellent agent supply part 260 has a nozzle 262a and a nozzle 262b. The nozzle 262a and the nozzle 262b are disposed inside the chamber 210 and outside the treatment tank 230. The nozzle 262a and the nozzle 262b are positioned parallel to the horizontal direction. The nozzle 262a and the nozzle 262b spout vapor of a water repellent agent.

The liquid discharge part 270 discharges the stored liquid L in the treatment tank 230. The inside of the treatment tank 230 can be made empty by the liquid discharge part 270. In addition, the stored liquid L in the treatment tank 230 can be replaced by the liquid supply part 232 and the liquid discharge part 270.

Subsequently, the third treatment device 200 will also be described with reference to FIG. 9. FIG. 9 is a schematic view of the third treatment device 200 in the substrate treatment apparatus 100 of the present embodiment.

As illustrated in FIG. 9, the third treatment device 200 further includes an inert gas supply source NGS; an IPA supply source IPS; a water repellent agent supply source SMS; a DIW supply source DS; a decompression part 280; pipings 230a, 230c, 240a, 250a, 250c, 250s, and 260a; valves 230b, 230d, 240b, 250b, 250d, 250t, 260b, and 270b; heaters 240c and 260c; a liquid discharge line 270a; and a gas discharge line 280a.

The DIW supply source DS supplies DIW. The IPA supply source IPS supplies an IPA. The inert gas supply source NGS supplies an inert gas. For example, the inert gas is nitrogen gas. The water repellent agent supply source SMS supplies the water repellent agent SMT.

The liquid supply part 232 has the piping 230a, the nozzle 232a, and the nozzle 232b. The DIW is supplied to the piping 230a from the DIW supply source DS. The piping 230a causes the DIW supplied from the DIW supply source DS to circulate to the nozzle 232a and the nozzle 232b.

The nozzle 232a and the nozzle 232b are hollow tubular members in which a plurality of spout holes is formed. In the present embodiment, the nozzle 232a and the nozzle 232b extend in the Y direction. The plurality of spout holes of the nozzle 232a is formed at equal intervals in the Y direction. Similarly, the plurality of spout holes of the nozzle 232b is formed at equal intervals in the Y direction.

If the DIW is supplied to the nozzle 232a via the piping 230a, the DIW is spouted into the treatment tank 230 through the plurality of spout holes of the nozzle 232a. Similarly, if the DIW is supplied to the nozzle 232b via the piping 230a, the DIW is spouted into the treatment tank 230 through the plurality of spout holes of the nozzle 232b.

The valve 230b is interposed in the piping 230a. The valve 230b is an opening-closing valve for opening and closing a flow channel of the piping 230a. The valve 230b controls circulation of the DIW flowing in the piping 230a. The valve 230b also functions as a regulating valve for regulating the flow rate of the DIW flowing in the piping 230a. For example, the valve 230b is an electromagnetic valve. The valve 230b is controlled by the control device 290 (the control part 292).

An IPA is supplied to the piping 230c from the IPA supply source IPS. The piping 230c is connected to the piping 230a. Namely, the piping 230c causes the IPA to circulate to the piping 230a.

The valve 230d is interposed in the piping 230c. The valve 230d is an opening-closing valve for opening and closing a flow channel of the piping 230c. Similar to the valve 250b, the valve 230d controls circulation of the IPA flowing in the piping 230c. The valve 230d also functions as a regulating valve for regulating the flow rate of the IPA flowing in the piping 230c. For example, the valve 230d is an electromagnetic valve. The valve 230d is controlled by the control device 290 (the control part 292).

When the DIW is stored in the treatment tank 230, the control device 290 (the control part 292) opens the valve 230b and closes the valve 230d. Accordingly, the DIW is spouted into the treatment tank 230 through the nozzle 232a and the nozzle 232b.

Meanwhile, when a dIPA is stored in the treatment tank 230, the control device 290 (the control part 292) opens the valve 230b and the valve 230d. When the valve 230b and the valve 230d are opened, the IPA flows into the piping 230a from the piping 230c, and the IPA joins the DIW circulating in the piping 230a, thereby generating a dIPA inside the piping 230a. The dIPA is supplied to the nozzle 232a and the nozzle 232b via the piping 230a. As a result, the dIPA is spouted into the treatment tank 230 through the nozzle 232a and the nozzle 232b.

In addition, the control device 290 (the control part 292) regulates opening degrees of the valve 230b and the valve 230d such that the concentration of the IPA becomes a predetermined concentration in the dIPA. A predetermined concentration is within a range of 0.3% to less than 5%.

The IPA supply part 240 has the piping 240a, the nozzle 242a, the nozzle 242b, and the heater 240c. An IPA is supplied to the piping 240a from the IPA supply source IPS. The heater 240c is interposed in the piping 240a. The heater 240c heats the IPA and gasifies the IPA. Namely, the heater 240c generates vapor of the IPA. The piping 240a causes vapor of the IPA to circulate to the nozzle 242a and the nozzle 242b.

The nozzle 242a and the nozzle 242b are disposed below the nozzle 252a and the nozzle 252b and are disposed below the nozzle 252c and the nozzle 252d. The nozzle 242a and the nozzle 242b are hollow tubular members in which a plurality of spout holes is formed. In the present embodiment, the nozzle 242a and the nozzle 242b extend in the Y direction. The plurality of spout holes of the nozzle 242a is formed at equal intervals in the Y direction. Similarly, the plurality of spout holes of the nozzle 242b is formed at equal intervals in the Y direction.

If vapor of the IPA is supplied to the nozzle 242a via the piping 240a, the vapor of the IPA is spouted into the chamber 210 through the plurality of spout holes of the nozzle 242a. Similarly, if vapor of the IPA is supplied to the nozzle 242*b* via the piping 240*a*, the vapor of the IPA is spouted into the chamber 210 through the plurality of spout holes of the nozzle 242*b*.

The valve 240*b* is interposed in the piping 240*a*. The valve 240*b* is an opening-closing valve for opening and closing a flow channel of the piping 240*a*. The valve 240*b* is provided on a downstream side of the heater 240*c* with respect to the piping 240*a*. The valve 240*b* controls circulation of vapor of the IPA flowing in the piping 240*a*. The valve 240*b* also functions as a regulating valve for regulating the flow rate of the vapor of the IPA flowing in the piping 240*a*. For example, the valve 240*b* is an electromagnetic valve. The valve 240*b* is controlled by the control device 290 (the control part 292).

The inert gas supply part 250 has the piping 250*a*, the piping 250*c*, the nozzle 252*a*, the nozzle 252*b*, the nozzle 252*c*, and the nozzle 252*d*. An inert gas is supplied to the piping 250*a* from the inert gas supply source NGS. The piping 250*a* causes the inert gas supplied from the inert gas supply source NGS to circulate to the nozzle 252*a* and the nozzle 252*b*. In addition, the inert gas is supplied to the piping 250*c* from the inert gas supply source NGS. The piping 250*c* causes the inert gas supplied from the inert gas supply source NGS to circulate to the nozzle 252*c* and the nozzle 252*d*.

The constitutions of the nozzle 252*a*, the nozzle 252*b*, the nozzle 252*c*, and the nozzle 252*d* are similar to those of the nozzle 242*a* and the nozzle 242*b*. The nozzle 252*a*, the nozzle 252*b*, the nozzle 252*c*, and the nozzle 252*d* spout the inert gas into the chamber 210.

The valve 250*b* is interposed in the piping 250*a*. The valve 250*b* is an opening-closing valve for opening and closing a flow channel of the piping 250*a*. The valve 250*b* controls circulation of the inert gas flowing in the piping 250*a*. Specifically, when the valve 250*b* is opened, the inert gas flows to the nozzle 252*a* and the nozzle 252*b* via the piping 250*a*. As a result, the inert gas is spouted through the nozzle 252*a* and the nozzle 252*b*. When the valve 250*b* is closed, circulation of the inert gas is blocked, and the nozzle 252*a* and the nozzle 252*b* stop spouting of the inert gas.

The valve 250*b* also functions as a regulating valve for regulating the flow rate of the inert gas flowing in the piping 250*a*. For example, the valve 250*b* is an electromagnetic valve. The valve 250*b* is controlled by the control device 290 (the control part 292).

The valve 250*d* is interposed in the piping 250*c*. The valve 250*d* is an opening-closing valve for opening and closing a flow channel of the piping 250*c*. The valve 250*d* controls circulation of the inert gas flowing in the piping 250*c*. Specifically, when the valve 250*d* is opened, the inert gas flows to the nozzle 252*c* and the nozzle 252*d* via the piping 250*c*. As a result, the inert gas is spouted through the nozzle 252*c* and the nozzle 252*d*. When the valve 250*d* is closed, circulation of the inert gas is blocked, and the nozzle 252*d* and the nozzle 252*d* stop spouting of the inert gas.

The valve 250*d* also functions as a regulating valve for regulating the flow rate of the inert gas flowing in the piping 250*c*. For example, the valve 250*d* is an electromagnetic valve. The valve 250*d* is controlled by the control device 290 (the control part 292).

In addition, the inert gas is supplied to the piping 250*s* from the inert gas supply source NGS. The piping 250*s* is connected to the piping 240*a*. Namely, the piping 250*s* causes the inert gas to circulate to the piping 240*a*.

The valve 250*t* is interposed in the piping 250*s*. The valve 250*t* is an opening-closing valve for opening and closing a flow channel of the piping 250*s*. Similar to the valve 250*b*, the valve 250*t* controls circulation of the inert gas flowing in the piping 250*s*. The valve 250*t* also functions as a regulating valve for regulating the flow rate of the inert gas flowing in the piping 250*s*. For example, the valve 250*t* is an electromagnetic valve. The valve 250*t* is controlled by the control device 290 (the control part 292).

When vapor of the IPA is spouted through the nozzle 242*a* and the nozzle 242*b*, the control device 290 (the control part 292) opens the valve 240*b* and closes the valve 250*t*. Meanwhile, when the inert gas is spouted through the nozzle 242*a* and the nozzle 242*b*, the control device 290 (the control part 292) closes the valve 240*b* and opens the valve 250*t*. When the valve 250*t* is opened, the inert gas flows into the piping 240*a* from the piping 250*s*, and the inert gas is supplied to the nozzle 242*a* and the nozzle 242*b* via the piping 240*a*. As a result, the inert gas is spouted into the chamber 210 through the nozzle 242*a* and the nozzle 242*b*.

The water repellent agent supply part 260 has the piping 260*a*, the nozzle 262*a*, the nozzle 262*b*, and the heater 260*c*. The water repellent agent SMT is supplied to the piping 260*a* from the water repellent agent supply source SMS. The heater 260*c* is interposed in the piping 260*a*. The heater 260*c* heats the water repellent agent SMT and gasifies the water repellent agent SMT. Namely, the heater 260*c* generates vapor of the water repellent agent SMT. The piping 260*a* causes vapor of the water repellent agent SMT to circulate to the nozzle 262*a* and the nozzle 262*b*.

The nozzle 262*a* and the nozzle 262*b* are disposed below the nozzle 252*c* and the nozzle 252*d*. The constitutions of the nozzle 262*a* and the nozzle 262*b* are similar to those of the nozzle 242*a* and the nozzle 242*b*. Similar to the nozzle 242*a* and the nozzle 242*b*, the nozzle 262*a* and the nozzle 262*b* spout vapor of the water repellent agent SMT to the inside of the chamber 210.

The valve 260*b* is interposed in the piping 260*a*. The valve 260*b* is an opening-closing valve for opening and closing a flow channel of the piping 260*a*. The valve 260*b* is provided on a downstream side of the heater 260*c* with respect to the piping 260*a*. The valve 260*b* controls circulation of vapor of the water repellent agent SMT flowing in the piping 260*a*. The valve 260*b* also functions as a regulating valve for regulating the flow rate of vapor of the water repellent agent SMT flowing in the piping 260*a*. For example, the valve 260*b* is an electromagnetic valve. The valve 260*b* is controlled by the control device 290 (the control part 292).

The liquid discharge line 270*a* is connected to a bottom part of the treatment tank 230. The valve 270*b* is interposed in the liquid discharge line 270*a*. The valve 270*b* is an opening-closing valve for opening and closing a flow channel of the liquid discharge line 270*a*. For example, the valve 270*b* is an electromagnetic valve. The valve 270*b* is controlled by the control device 290 (the control part 292). When the stored liquid L is stored inside the treatment tank 230, the control device 290 (the control part 292) closes the valve 270*b*. Meanwhile, when the stored liquid L is discharged from the treatment tank 230, the control device 290 (the control part 292) opens the valve 270*b*. When the valve 270*b* is opened, the stored liquid L stored in the treatment tank 230 discharged out of the chamber 210 from the treatment tank 230 via the liquid discharge line 270*a*.

The decompression part 280 reduces the pressure inside the chamber 210. Namely, the decompression part 280 decompresses the inside of the chamber 210. For example, the decompression part 280 includes a gas discharge pump. For example, the gas discharge pump is a vacuum pump. The decompression part 280 is controlled by the control device 290 (the control part 292). Specifically, the decompression part 280 is connected to the chamber 210 via the gas discharge line 280*a*. The decompression part 280 discharges the gas inside the chamber 210 when the cover 214 is in a closed state and decompresses the inside of the chamber 210 to a pressure lower than the atmospheric pressure.

Next, with reference to FIGS. 8 to 13, drying treatment performed by the third treatment device 200 in the substrate treatment apparatus 100 of the present embodiment will be described. FIGS. 10 to 13 are schematic views illustrating a flow of drying treatment performed by the third treatment device 200.

As illustrated in (a) of FIG. 10, in Step S1, the third treatment device 200 stands by until the substrates W are fed to the chamber 210. When it stands by for feeding of the substrates W, the treatment tank 230 stores DIW as a stored liquid. In this specification, when the stored liquid L stored in the treatment tank 230 is DIW, the stored liquid L may be indicated as a stored liquid La. At this time, the substrate holding part 220 is immersed in the stored liquid La.

It is preferable that the nozzle 232*a* and the nozzle 232*b* further supply DIW to the stored liquid La stored in the treatment tank 230 such that the stored liquid La inside the treatment tank 230 does not become stagnate. Accordingly, contamination of the treatment tank 230 due to dust or the like inside the chamber 210 can be curbed.

As illustrated in (b) of FIG. 10, in Step S2, before the substrates W are accommodated inside the chamber 210, the substrate holding part 220 moves from the lower position to the upper position. In addition, the nozzle 242*a* and the nozzle 242*b* start supplying of the inert gas to inside the chamber 210. The nozzle 232*a* and the nozzle 232*b* continuously supplies DIW to the treatment tank 230.

As illustrated in (c) of FIG. 10, in Step S3, the nozzle 232*a* and the nozzle 232*b* stop supplying of DIW and discharge the stored liquid La in the treatment tank 230. At this time, the nozzle 242*a* and the nozzle 242*b* continuously supply the inert gas to the inside of the chamber 210.

As illustrated in (d) of FIG. 10, in Step S4, a dIPA is supplied to the treatment tank 230. The nozzle 232*a* and the nozzle 232*b* supply the dIPA to the treatment tank 230 so that the stored liquid Ld is stored in the treatment tank 230. At this time, the nozzle 242*a* and the nozzle 242*b* continuously supply the inert gas to the inside of the chamber 210.

As illustrated in (e) of FIG. 10, in Step S5, when the treatment tank 230 stores the stored liquid Ld, the nozzle 232*a* and the nozzle 232*b* stop supplying of the dIPA. At this time, the nozzle 242*a* and the nozzle 242*b* continuously supply the inert gas to the inside of the chamber 210.

As illustrated in (f) of FIG. 10, in Step S6, the substrates W are immersed in the dIPA stored in the treatment tank 230. The substrate holding part 220 receives the substrates W at the upper position and moves downward to the lower position while holding the substrates W. At this time, the nozzle 242*a* and the nozzle 242*b* continuously supply the inert gas to the inside of the chamber 210. However, when the substrates W move downward from the upper position to the lower position, the nozzle 242*a* and the nozzle 242*b* stop supplying of the inert gas only at a timing when the substrates W pass therethrough such that the substrates W are not directly exposed to the inert gas.

In the treatment tank 230, the nozzle 232*a* and the nozzle 232*b* supply the dIPA to the treatment tank 230. Accordingly, an upflow is formed in the stored liquid Ld in the treatment tank 230, and the substrates W immersed in the treatment tank 230 are efficiently treated with the dIPA.

As illustrated in (a) of FIG. 11, in Step S7, the nozzle 232*a* and the nozzle 232*b* stop supplying of the dIPA. At this time, the nozzle 242*a* and the nozzle 242*b* continuously supply the inert gas to the inside of the chamber 210.

As illustrated in (b) of FIG. 11, in Step S8, while the nozzle 242*a* and the nozzle 242*b* continuously supply the inert gas to the inside of the chamber 210, the decompression part 280 starts decompression of the inside of the chamber 210. At this time, the substrate holding part 220 remains at the lower position.

As illustrated in (c) of FIG. 11, in Step S9, the nozzle 242*a* and the nozzle 242*b* stop supplying of the inert gas and start supplying of vapor of the IPA. At this time, the decompression part 280 continues decompression of the inside of the chamber 210.

As illustrated in (d) of FIG. 11, in Step S10, the substrate holding part 220 moves from the lower position to the upper position, and the nozzle 242*a* and the nozzle 242*b* continue supplying of vapor of the IPA. Accordingly, the substrates W are treated with the IPA. At this time, the decompression part 280 continues decompression of the inside of the chamber 210.

As illustrated in (e) of FIG. 11, in Step S11, the nozzle 242*a* and the nozzle 242*b* continue supplying of vapor of the IPA. In addition, the liquid discharge part 270 discharges the stored liquid Ld in the treatment tank 230. When the stored liquid Ld in the treatment tank 230 is discharged, the substrate holding part 220 moves downward to the lower position inside the treatment tank 230. The decompression part 280 continues decompression of the inside of the chamber 210.

As illustrated in (a) of FIG. 12, in Step S12, while the nozzle 242*a* and the nozzle 242*b* continuously supply vapor of the IPA, the substrate holding part 220 moves from the lower position to the upper position. The substrate holding part 220 moves to a position where the substrates W face the nozzle 242*a* and the nozzle 242*b*. For example, the nozzle 242*a* and the nozzle 242*b* face the centers of the substrates W. In addition, the nozzles 262*a* and 262*b* start supplying of vapor of the water repellent agent SMT. The decompression part 280 continues decompression of the inside of the chamber 210. The substrate holding part 220 may repeat vertical movement in the vertical direction at the upper position. The water repellent agent SMT can be uniformly applied to the substrates W by vertically moving the substrates W while vapor of the water repellent agent SMT is supplied. In addition, the substrates W may be exposed to the atmosphere of vapor of the water repellent agent SMT by stopping supplying of vapor of the water repellent agent SMT for a certain period of time. Accordingly, the time for the substrates W to be exposed to vapor of the water repellent agent SMT can be lengthened while the consumption of the water repellent agent SMT is curbed, and collapse of the patterns of the substrates W can be efficiently curbed.

As illustrated in (b) of FIG. 12, in Step S13, while the nozzle 262*a* and the nozzle 262*b* continuously supply vapor of the water repellent agent SMT, the nozzle 242*a* and the nozzle 242*b* stop supplying of vapor of the IPA. The decompression part 280 continues decompression of the inside of the chamber 210. The substrate holding part 220 moves to a position where lower ends of the substrates W face the nozzle 262*a* and the nozzle 262*b* at the upper position. The substrate holding part 220 may repeat vertical movement in the vertical direction at the upper position. In addition, the substrates W may be exposed to the atmosphere of vapor of the water repellent agent SMT by stopping supplying of vapor of the water repellent agent SMT for a certain period of time.

As illustrated in (c) of FIG. 12, in Step S14, while the nozzles 262a and 262b continuously supply vapor of the water repellent agent SMT, the nozzle 242a and the nozzle 242b start supplying of vapor of the IPA. The decompression part 280 continues decompression of the inside of the chamber 210. The substrate holding part 220 is positioned at a position where the lower ends of the substrates W face the nozzle 262a and the nozzle 262b at the upper position. The substrate holding part 220 may repeat vertical movement in the vertical direction at the upper position. In addition, the substrates W may be exposed to the atmosphere of vapor of the water repellent agent SMT by stopping supplying of vapor of the water repellent agent SMT for a certain period of time.

As illustrated in (d) of FIG. 12, in Step S15, while the nozzle 242a and the nozzle 242b continuously supply vapor of the IPA, the nozzle 262a and the nozzle 262b stop supplying of vapor of the water repellent agent SMT. The decompression part 280 continues decompression of the inside of the chamber 210. The substrate holding part 220 moves to a position where the substrates W face the nozzle 242a and the nozzle 242b at the upper position. For example, the nozzle 242a and the nozzle 242b face the centers of the substrates W. The substrate holding part 220 may repeat vertical movement in the vertical direction at the upper position.

As illustrated in (a) of FIG. 13, in Step S16, the nozzle 242a and the nozzle 242b stop supplying of vapor of the IPA and start supplying of the inert gas. The decompression part 280 continues decompression of the inside of the chamber 210. The substrate holding part 220 remains at a position where the substrates W face the nozzle 242a and the nozzle 242b at the upper position.

As illustrated in (b) of FIG. 13, in Step S17, while the nozzle 242a and the nozzle 242b continuously supply the inert gas, the nozzles 252a, 252b, 252c, and 252d start supplying of the inert gas. The decompression part 280 continues decompression of the inside of the chamber 210. The substrate holding part 220 remains at a position where the substrates W face the nozzle 242a and the nozzle 242b at the upper position.

As illustrated in (c) of FIG. 13, in Step S18, the nozzles 242a and 242b and the nozzles 252a, 252b, 252c, and 252d continue supplying of the inert gas. The decompression part 280 stops decompression of the inside of the chamber 210.

As illustrated in (d) of FIG. 13, in Step S19, while the nozzle 242a and the nozzle 242b continuously supply the inert gas, the nozzles 252a, 252b, 252c, and 252d stop supplying of the inert gas. The substrate holding part 220 remains at a position where the substrates W face the nozzle 242a and the nozzle 242b at the upper position.

As above, the third treatment device 200 performs drying treatment of the substrates W.

In the present embodiment, after the substrates W are immersed in a dIPA, IPA treatment of the substrates W is performed. Thereafter, the water repellent agent SMT is supplied. For this reason, the water repellent agent SMT can sufficiently infiltrate onto the surfaces of the substrates W, and collapse of the patterns in the substrates W can be curbed.

In the description described above with reference to FIGS. 10 to 13, as illustrated in (d) of FIG. 10, when the stored liquid Ld is stored in the treatment tank 230, after the stored liquid La which has been previously stored in the treatment tank 230 is discharged, a dIPA is supplied to the treatment tank 230 and the stored liquid Ld is stored in the treatment tank 230, but the present embodiment is not limited thereto. The stored liquid Ld may be generated in the treatment tank 230 utilizing the stored liquid instead of discharging it. For example, when water (for example, DIW) is stored in the treatment tank 230 as the stored liquid L (that is, the treatment tank 230 stores the stored liquid La), the liquid supply part 232 may supply an IPA to the stored liquid La so as to generate the stored liquid Ld in the treatment tank 230.

In addition, in the description described above with reference to FIGS. 10 to 13, from Step S6 illustrated in (f) of FIG. 10 to Step S9 illustrated in (c) of FIG. 11, while the substrates W are immersed in the stored liquid Ld, the concentration of the stored liquid Ld has been constant, but the present embodiment is not limited thereto. While the substrates W are immersed in the stored liquid Ld, the concentration of the stored liquid Ld may be increased. For example, when the liquid supply part 232 further supplies an IPA to the stored liquid Ld in the treatment tank 230, the concentration of the stored liquid Ld can be increased.

In the description described above with reference to (a) to (e) of FIG. 7, the substrates W are immersed in a dIPA before the water-repellent treatment, and vapor of an IPA liquid is spouted onto the substrates W after the water-repellent treatment, but the present embodiment is not limited thereto. The substrates W may be immersed in a dIPA after the water-repellent treatment.

Next, with reference to FIG. 14, water-repellent treatment performed by the substrate treatment apparatus 100 of the present embodiment will be described. (a) to (f) of FIG. 14 are schematic views illustrating a flow of water-repellent treatment performed by the substrate treatment apparatus 100 of the present embodiment. (a) to (c) and (e) to (f) of FIGS. 1414A to 14C and 14E to 14F are similar to (a) to (e) of FIG. 7, and duplicate description will be omitted for the purpose of avoiding redundancy.

As illustrated in (a) of FIG. 14, the substrates W are immersed in a dIPA stored in the treatment tank 230. While the substrate holding part 220 is positioned at the upper position, the stored liquid Ld is stored in the treatment tank 230. Thereafter, the substrate holding part 220 receives the substrates W. Typically, the substrates W received by the substrate holding part 220 are subjected to rinse treatment with water (for example, DIW). Thereafter, the substrate holding part 220 moves downward from above the chamber 210 so that the substrates W are immersed in the stored liquid Ld stored in the treatment tank 230.

As illustrated in (b) of FIG. 14, IPA treatment of the substrates W is performed by supplying vapor of an IPA to the substrates W. In detail, after the substrate holding part 220 moves the substrates W to the upper position, the IPA supply part 240 supplies vapor of the IPA to the substrates W. Accordingly, the substrates W can be treated with the IPA. Here, the stored liquid Ld in the treatment tank 230 is discharged.

As illustrated in (c) of FIG. 14, water-repellent treatment of the substrates W is performed by supplying vapor of the water repellent agent SMT to the substrates W. While the substrate holding part 220 is positioned at the upper position, the water repellent agent supply part 260 supplies vapor of the water repellent agent SMT to the substrates W. Accordingly, the substrates W can be subjected to water-repellent treatment.

As illustrated in (d) of FIG. 14, the substrates W are immersed in the dIPA stored in the treatment tank 230 again.

While the substrate holding part 220 is positioned at the upper position, the stored liquid Ld is stored in the treatment tank 230. Thereafter, the substrate holding part 220 moves downward from above the chamber 210 so that the substrates W are immersed in the stored liquid Ld stored in the treatment tank 230.

As illustrated in (e) of FIG. 14, IPA treatment of the substrates W is performed by supplying vapor of an IPA to the substrates W. The substrate holding part 220 moves from the lower position to the upper position. The IPA supply part 240 supplies vapor of the IPA to the substrates W. Accordingly, the substrates W can be treated with the IPA.

As illustrated in (f) of FIG. 14, an inert gas is supplied to the substrates W. While the substrate holding part 220 is positioned at the upper position, the inert gas supply part 250 supplies the inert gas to the substrates W. Accordingly, the substrates W can be dried.

According to the present embodiment, after the substrates W are subjected to water-repellent treatment, the substrates W are immersed in a dIPA. For this reason, cleanness of the substrates W can be improved.

In the description described above with reference to FIG. 14, after the stored liquid Ld having the substrates W immersed therein is temporarily discharged before the water-repellent treatment, a new stored liquid Ld is stored in the treatment tank 230 after the water-repellent treatment, but the present embodiment is not limited thereto. The substrates W may be immersed after the water-repellent treatment without temporarily discharging the stored liquid Ld having the substrates W immersed therein before the water-repellent treatment.

In the substrate treatment apparatus 100 described above with reference to FIG. 1, the treatment part 130 has each one of the first treatment device 140, the second treatment device 150, and the third treatment device 200, but the present embodiment is not limited thereto. In the treatment part 130, any of the first treatment device 140, the second treatment device 150, and the third treatment device 200 may be two or more.

Next, the substrate treatment apparatus 100 of the present embodiment will be described with reference to FIG. 15. FIG. 15 is a schematic view of the substrate treatment apparatus 100. The substrate treatment apparatus 100 in FIG. 15 has a constitution similar to that of the substrate treatment apparatus 100 described above with reference to FIG. 1 except that the treatment part 130 has three sets of the first treatment device 140 and the second treatment device 150 and two third treatment devices 200 and further includes a conveyance device LF, and duplicate description will be omitted for the purpose of avoiding redundancy.

As illustrated in FIG. 15, in the substrate treatment apparatus 100, the treatment part 130 has a first treatment unit 130a, a second treatment unit 130b, a third treatment unit 130c, and a drying treatment unit 130d. Each of the first treatment unit 130a, the second treatment unit 130b, and the third treatment unit 130c has the first treatment device 140, the second treatment device 150, and the conveyance device LF. The drying treatment unit 130d has two third treatment devices 200a and 200b.

The second conveyance device WTR can move from the third treatment device 200a to the third treatment unit 130c in the longitudinal direction of the substrate treatment apparatus 100. Therefore, the second conveyance device WTR carries in and carries out the lot of the substrates W with respect to the third treatment devices 200a and 200b, a first treatment device 140a and a second treatment device 150a of the first treatment unit 130a, a first treatment device 140b and a second treatment device 150b of the second treatment unit 130b, and a first treatment device 140c and a second treatment device 150c of the third treatment unit 130c.

In the drying treatment unit 130d, the third treatment devices 200a and 200b store lots of a plurality of substrates W and perform drying treatment with respect to the plurality of substrates W.

The first treatment unit 130a is disposed adjacent to the drying treatment unit 130d. In the first treatment unit 130a, each of the first treatment device 140a and the second treatment device 150a includes a tank (not illustrated). Further, the first treatment device 140a causes the substrates W to be immersed in a chemical solution stored in the tank and performs treatment with respect to a plurality of substrates W with the chemical solution. Alternatively, the second treatment device 150a causes the substrates W to be immersed in a rinse liquid stored in the tank and performs cleaning treatment with respect to a plurality of substrates W with a rinse liquid.

In addition, in the first treatment unit 130a, the conveyance device LF performs delivering of a lot with respect to the second conveyance device WTR in addition to conveyance of a lot inside the first treatment unit 130a. In addition, the conveyance device LF causes each of the substrates W in the lot to be immersed in the tanks of the first treatment device 140a and the second treatment device 150a or brings up each of the substrates W in the lot from the tanks of the first treatment device 140a and the second treatment device 150a.

The first treatment device 140b and the second treatment device 150b of the second treatment unit 130b adjacent to the first treatment unit 130a, and the first treatment device 140c and the second treatment device 150c of the third treatment unit 130c adjacent to the second treatment unit 130b have constitutions similar to those of the first treatment device 140a and the second treatment device 150a of the first treatment unit 130a.

According to the present embodiment, since the substrate treatment apparatus 100 has three first treatment devices 140a to 140c, three second treatment devices 150a to 150c, and two third treatment devices 200a and 200b, lots of the substrates W are sequentially treated so that a number of substrates W can be efficiently treated.

In the description described above with reference to FIGS. 1 to 15, chemical solution treatment, rinse treatment, and drying treatment are respectively performed by the first treatment device 140, the second treatment device 150, and the third treatment device 200, but the present embodiment is not limited thereto. Any two processes of treatment of the chemical solution treatment, rinse treatment, and drying treatment may be performed by the same treatment device.

For example, the treatment part 130 may have the first treatment device 140 and the third treatment device 200 without having the second treatment device 150. In this case, after the chemical solution treatment of the substrates W is performed by the first treatment device 140, the substrates W may be conveyed to the third treatment device 200 and may be subjected to rinse treatment with DIW stored in the treatment tank 230 inside the third treatment device 200. As an example, thereafter, in a state in which the substrates W are brought upward above the chamber 210 from the treatment tank 230, the stored liquid inside the treatment tank 230 may be changed to a dIPA. Alternatively, when the liquid supply part 232 supplies an IPA to the treatment tank 230 storing DIW, a dIPA may be generated in the treatment tank 230.

Moreover, in the description described above with reference to FIGS. 1 to 15, as described above particularly with reference to FIG. 6 to (e) of FIG. 7, the third treatment device 200 performs IPA treatment, water-repellent treatment, IPA treatment, and inert gas supply treatment in addition to dIPA immersion, but the present embodiment is not limited thereto. Any treatment of IPA treatment, water-repellent treatment, IPA treatment, and inert gas supply treatment may be performed by a device other than the third treatment device 200.

The disclosure provides a substrate treatment method including a rinsing step of performing treatment of a substrate with a rinse liquid, an immersing step of immersing the substrate in a diluted isopropyl alcohol stored in a treatment tank after the rinsing step, a first isopropyl alcohol treatment step of performing treatment of the substrate with an isopropyl alcohol after the immersing step, and a water-repellent treatment step of performing water-repellent treatment of the substrate after the first isopropyl alcohol treatment step.

In a certain embodiment, in the immersing step, a concentration of the diluted isopropyl alcohol increases in accordance with a time of immersion of the substrate.

In a certain embodiment, the rinsing step is performed by a rinse treatment device. The immersing step is performed by a drying treatment device. The substrate treatment method further includes a conveying step of conveying the substrate from the rinse treatment device to the drying treatment device after the rinsing step and before the immersing step.

In a certain embodiment, the substrate treatment method further includes a step of storing the diluted isopropyl alcohol in the treatment tank in a state in which an inert gas is supplied to a chamber accommodating the treatment tank before the immersing step.

In a certain embodiment, the substrate treatment method further includes a second isopropyl alcohol treatment step of performing treatment of the substrate with an isopropyl alcohol after the water-repellent treatment step, and an inert gas supplying step of supplying an inert gas to the substrate after the second isopropyl alcohol treatment step.

In a certain embodiment, the substrate treatment method further includes an immersing step of immersing the substrate in a diluted isopropyl alcohol stored in the treatment tank after the water-repellent treatment step and before the second isopropyl alcohol treatment step.

The disclosure provides a substrate treatment apparatus including a chamber; a treatment tank that is disposed inside the chamber and stores a stored liquid; a substrate holding part that holds a substrate and is able to move such that the substrate is immersed in the stored liquid in the treatment tank; a liquid supply part that supplies a diluted isopropyl alcohol as the stored liquid to the treatment tank; an isopropyl alcohol supply part that supplies vapor of an isopropyl alcohol to the inside of the chamber; a water repellent agent supply part that supplies vapor of a water repellent agent to the inside of the chamber; and a control part that controls the substrate holding part, the liquid supply part, the isopropyl alcohol supply part, and the water repellent agent supply part. The control part controls the substrate holding part, the isopropyl alcohol supply part, and the water repellent agent supply part such that after a substrate which has been treated with a rinse liquid is immersed in a diluted isopropyl alcohol stored in the treatment tank, vapor of an isopropyl alcohol is supplied to the substrate, and vapor of the water repellent agent is supplied to the substrate thereafter.

In a certain embodiment, the control part controls the liquid supply part such that a concentration of the diluted isopropyl alcohol increases in accordance with a time of immersion of the substrate in the diluted isopropyl alcohol in the treatment tank.

In a certain embodiment, the substrate treatment apparatus further includes a drying treatment device that includes the chamber, the treatment tank, the substrate holding part, the isopropyl alcohol supply part, and the water repellent agent supply part; a rinse treatment device that performs treatment of the substrate with the rinse liquid; and a conveyance device that conveys a substrate which has been treated with the rinse liquid by the rinse treatment device to the drying treatment device.

In a certain embodiment, the substrate treatment apparatus further includes an inert gas supply part that supplies vapor of an inert gas to the inside of the chamber. The control part controls the liquid supply part and the inert gas supply part such that the diluted isopropyl alcohol is supplied to the treatment tank in a state in which an inert gas is supplied to the chamber.

In a certain embodiment, the control part controls the isopropyl alcohol supply part and the inert gas supply part such that after the water repellent agent is supplied to the substrate, vapor of an isopropyl alcohol is supplied to the substrate, and an inert gas is supplied to the substrate thereafter.

In a certain embodiment, the control part controls the substrate holding part such that the substrate is immersed in a diluted isopropyl alcohol stored in the treatment tank after the water repellent agent is supplied to the substrate and before vapor of the isopropyl alcohol is supplied to the substrate.

Hereinabove, the present embodiment has been described with reference to the drawings. However, the disclosure is not limited to the foregoing embodiment and can be performed in various aspects within a range not departing from the gist thereof. In addition, various embodiments can be formed by suitably combining a plurality of constituent elements disclosed in the foregoing embodiment. For example, some constituent elements may be deleted from all of the constituent elements described in the embodiment. Moreover, constituent elements in different embodiments may be suitably combined. The drawings are schematically illustrated centering on each of the constituent elements in order to facilitate the understanding, and a thickness, a length, a number, an interval, and the like of each of the illustrated constituent elements may differ from actual values for the sake of convenience of preparing the drawings. In addition, a material, a shape, a dimension, and the like of each of the constituent elements described in the foregoing embodiment are examples, which are not particularly limited, and various changes can be made within a range not practically departing from the effects of the present embodiment.

What is claimed is:
1. A substrate treatment method, comprising:
a rinsing step of performing treatment of a substrate with a rinse liquid;
an immersing step of immersing the substrate in a diluted isopropyl alcohol stored in a treatment tank after the rinsing step;
a first isopropyl alcohol treatment step of performing, after the immersing step, treatment of the substrate brought out of and located above the treatment tank with vapor of an isopropyl alcohol above the treatment tank in a state in which the treatment tank stores the diluted isopropyl alcohol; and a water-repellent treatment step of performing, after the first isopropyl alcohol treatment step, water-repellent treatment of the substrate above the treatment tank with vapor of a water repellent agent in a state in which the diluted isopropyl alcohol in the treatment tank has been discharged, wherein the rinsing step is performed by a rinse treatment device, wherein the immersing step is performed by a drying treatment device, and wherein the substrate treatment method further comprises a conveying step of conveying the substrate from the rinse treatment device to the drying treatment device after the rinsing step and before the immersing step.

2. A substrate treatment method, comprising:

a rinsing step of performing treatment of a substrate with a rinse liquid;

an immersing step of immersing the substrate in a diluted isopropyl alcohol stored in a treatment tank after the rinsing step;

a first isopropyl alcohol treatment step of performing, after the immersing step, treatment of the substrate brought out of the diluted isopropyl alcohol stored in the treatment tank to be located above the treatment tank with vapor of an isopropyl alcohol above the treatment tank in a state in which the treatment tank stores the diluted isopropyl alcohol; and a water-repellent treatment step of performing, after the first isopropyl alcohol treatment step, water-repellent treatment of the substrate above the treatment tank with vapor of a water repellent agent in a state in which the diluted isopropyl alcohol in the treatment tank has been discharged.

3. The substrate treatment method according to claim 2, wherein in the immersing step, a concentration of the diluted isopropyl alcohol increases in accordance with a time of immersion of the substrate.

4. The substrate treatment method according to claim 2, wherein the rinsing step is performed by a rinse treatment device, wherein the immersing step is performed by a drying treatment device, and wherein the substrate treatment method further comprises a conveying step of conveying the substrate from the rinse treatment device to the drying treatment device after the rinsing step and before the immersing step.

5. The substrate treatment method according to claim 2, further comprising:

a step of storing the diluted isopropyl alcohol in the treatment tank in a state in which an inert gas is supplied to a chamber accommodating the treatment tank before the immersing step.

6. The substrate treatment method according to claim 2, further comprising:

a second isopropyl alcohol treatment step of performing treatment of the substrate with vapor of an isopropyl alcohol after the water-repellent treatment step; and an inert gas supplying step of supplying an inert gas to the substrate after the second isopropyl alcohol treatment step.

7. The substrate treatment method according to claim 6, further comprising:

an immersing step of immersing the substrate in the diluted isopropyl alcohol stored in the treatment tank after the water-repellent treatment step and before the second isopropyl alcohol treatment step.

8. A substrate treatment apparatus, comprising:

a chamber;

a treatment tank that is disposed inside the chamber and stores a stored liquid;

a substrate holding part that holds a substrate and is able to move such that the substrate is immersed in the stored liquid in the treatment tank;

a liquid supply part that supplies a diluted isopropyl alcohol as the stored liquid to the treatment tank;

an isopropyl alcohol supply part that supplies vapor of an isopropyl alcohol to the inside of the chamber;

a water repellent agent supply part that supplies vapor of a water repellent agent to the inside of the chamber; and a control part that controls the substrate holding part, the liquid supply part, the isopropyl alcohol supply part, and the water repellent agent supply part, wherein the control part controls the substrate holding part, the isopropyl alcohol supply part, and the water repellent agent supply part such that after the substrate which has been treated with the rinse liquid is immersed in the diluted isopropyl alcohol stored in the treatment tank, the vapor of the isopropyl alcohol is supplied to the substrate, which is brought out of the diluted isopropyl alcohol stored in the treatment tank to be located above the treatment tank with vapor of an isopropyl alcohol above the treatment tank in a state in which the treatment tank stores the diluted isopropyl alcohol, and then the vapor of the water repellent agent is supplied to the substrate, which is above the treatment tank with vapor of the water repellent agent in a state in which the diluted isopropyl alcohol in the treatment tank has been discharged.

9. The substrate treatment apparatus according to claim 8, wherein the control part controls the liquid supply part such that a concentration of the diluted isopropyl alcohol increases in accordance with a time of immersion of the substrate in the diluted isopropyl alcohol in the treatment tank.

10. The substrate treatment apparatus according to claim 8, further comprising:

a drying treatment device that includes the chamber, the treatment tank, the substrate holding part, the isopropyl alcohol supply part, and the water repellent agent supply part;

a rinse treatment device that performs treatment of the substrate with the rinse liquid; and a conveyance device that conveys the substrate which has been treated with the rinse liquid by the rinse treatment device to the drying treatment device.

11. The substrate treatment apparatus according to claim 8, further comprising:

an inert gas supply part that supplies vapor of an inert gas to the inside of the chamber, wherein the control part controls the liquid supply part and the inert gas supply part such that the diluted isopropyl alcohol is supplied to the treatment tank in a state in which the inert gas is supplied to the chamber.

12. The substrate treatment apparatus according to claim 11, wherein the control part controls the isopropyl alcohol supply part and the inert gas supply part such that after the water repellent agent is supplied to the substrate, vapor of an isopropyl alcohol is supplied to the substrate, and then the inert gas is supplied to the substrate.

13. The substrate treatment apparatus according to claim 12,
wherein the control part controls the substrate holding part such that the substrate is immersed in the diluted isopropyl alcohol stored in the treatment tank after the water repellent agent is supplied to the substrate and before the vapor of the isopropyl alcohol is supplied to the substrate.

\* \* \* \* \*